United States Patent
Zhang et al.

(10) Patent No.: US 10,629,932 B2
(45) Date of Patent: Apr. 21, 2020

(54) METHOD AND SYSTEM FOR MONITORING STATE OF CHARGE (SOC) OF FLOW BATTERY SYSTEM

(71) Applicant: DALIAN RONGKEPOWER CO., LTD, Dalian, Liaoning (CN)

(72) Inventors: Yu Zhang, Liaoning (CN); Yi Zou, Liaoning (CN); Huamin Zhang, Liaoning (CN); Ying Li, Liaoning (CN); Xiaoli Wang, Liaoning (CN); Xi Han, Liaoning (CN); Lecong Han, Liaoning (CN); Tao Zhang, Liaoning (CN); Xiangkun Ma, Liaoning (CN); Honggui Zhao, Liaoning (CN)

(73) Assignee: DALIAN RONGKEPOWER CO., LTD, Dalian (CN)

( * ) Notice: Subject to any disclaimer, the term of this patent is extended or adjusted under 35 U.S.C. 154(b) by 0 days.

(21) Appl. No.: 16/412,747

(22) Filed: May 15, 2019

(65) Prior Publication Data

US 2019/0305345 A1    Oct. 3, 2019

Related U.S. Application Data

(63) Continuation of application No. 15/585,970, filed on May 3, 2017, now Pat. No. 10,424,797, which is a
(Continued)

(30) Foreign Application Priority Data

Nov. 3, 2014   (CN) .......................... 2014 1 0613631
Sep. 23, 2015  (CN) .......................... 2015 1 0613258

(51) Int. Cl.
*H01M 8/04537* (2016.01)
*G01R 31/367* (2019.01)
(Continued)

(52) U.S. Cl.
CPC ....... *H01M 8/04611* (2013.01); *G01R 31/367* (2019.01); *H01M 8/188* (2013.01);
(Continued)

(58) Field of Classification Search
CPC .... H01M 8/04611; H01M 8/188; H01M 8/20; G01R 31/367
See application file for complete search history.

(56) References Cited

U.S. PATENT DOCUMENTS

2009/0315698 A1    12/2009  Berdichevsky et al.
2014/0028260 A1*    1/2014  Goeltz .................. H01M 8/188
                                                          320/127
(Continued)

FOREIGN PATENT DOCUMENTS

CN    202144772 U    2/2012
CN    103033756 A    4/2013
(Continued)

*Primary Examiner* — Jayne L Mershon
(74) *Attorney, Agent, or Firm* — Novick, Kim & Lee, PLLC; Allen Xue

(57) ABSTRACT

An apparatus monitors the state of charge (SOC) of a flow battery system. The monitoring method include determining SOCs of at least two pairs of different monitoring positions. A pair of monitoring position may be located inside of an anode electrolyte storage tank (2) and inside of a cathode electrolyte storage tank (3), or inside of an anode electrolyte outlet pipeline (6) of a stack and inside of a cathode electrolyte outlet pipeline (7) of the stack, or inside of an anode electrolyte inlet pipeline (8) of the stack and inside of a cathode electrolyte inlet pipeline (9) of the stack. The $SOC_{sum}$ of the flow battery system is acquired according to the SOCs corresponding to different pair of monitoring positions, respectively. The method ensures acquiring an SOC monitoring result timely and accurately.

12 Claims, 13 Drawing Sheets

Related U.S. Application Data continuation-in-part of application No. PCT/CN2015/093707, filed on Nov. 3, 2015.

(51) Int. Cl.
    *H01M 8/20*     (2006.01)
    *H01M 8/18*     (2006.01)

(52) U.S. Cl.
    CPC .......... *H01M 8/20* (2013.01); *H01M 2250/10* (2013.01); *Y02E 60/528* (2013.01)

(56) References Cited

U.S. PATENT DOCUMENTS

| | | | |
|---|---|---|---|
| 2014/0139228 A1 | 5/2014 | Tennessen et al. | |
| 2015/0019149 A1* | 1/2015 | Li | G01R 31/3648 |
| | | | 702/63 |

FOREIGN PATENT DOCUMENTS

| | | |
|---|---|---|
| CN | 103197257 A | 7/2013 |
| CN | 203365539 U | 12/2013 |
| CN | 103781653 A | 5/2014 |
| DE | 102012014436 A1 | 5/2014 |
| WO | 2013010832 A1 | 1/2013 |

* cited by examiner

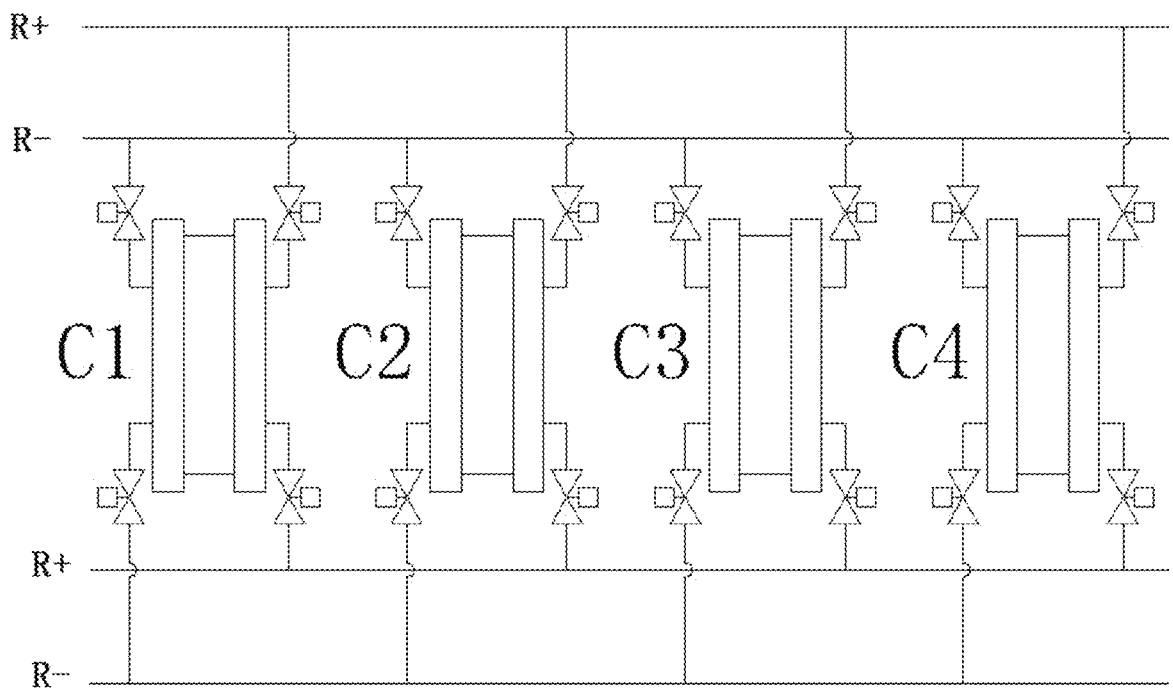
Fig. 5-a
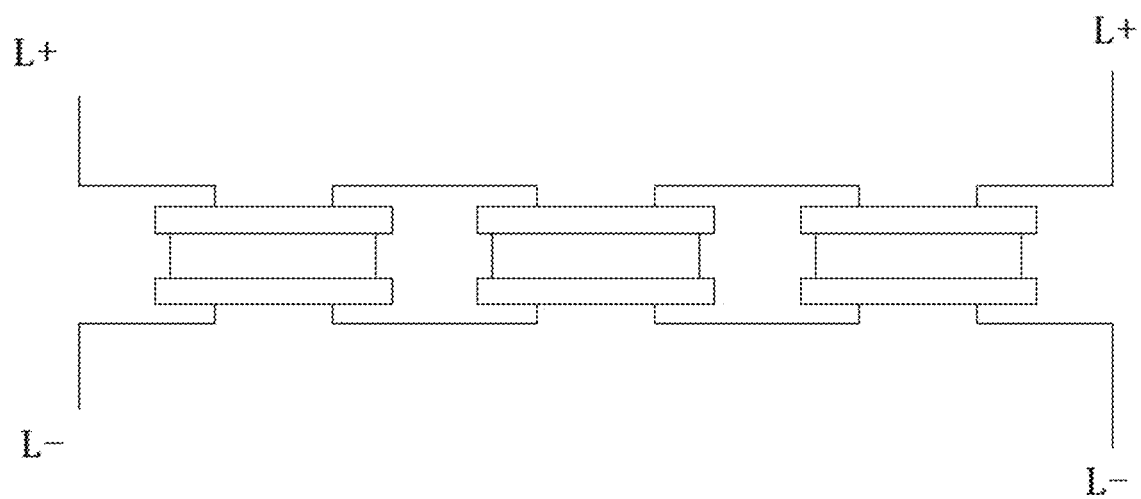
Fig. 5-b

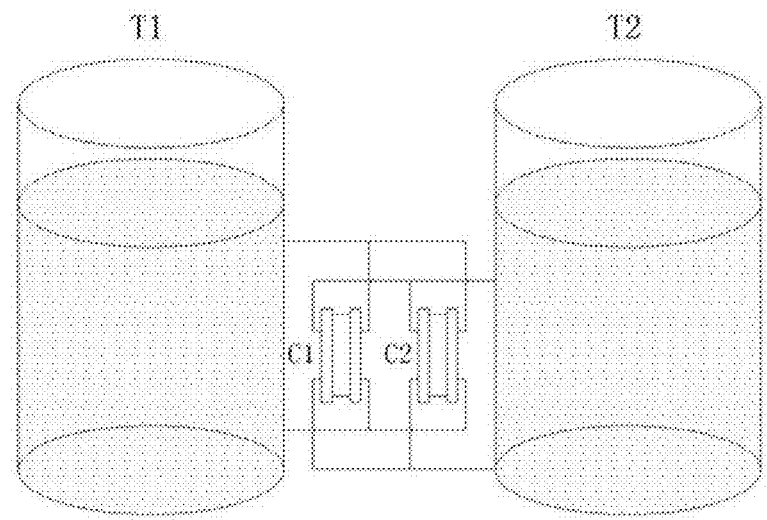
Fig. 5-c

PCS Power Percentage/%, Charging if it is a negative value, Discharging if it is a positive value

METHOD AND SYSTEM FOR MONITORING STATE OF CHARGE (SOC) OF FLOW BATTERY SYSTEM

CROSS-REFERENCE TO RELATED APPLICATIONS

This application is a continuation application of U.S. application Ser. No. 15/585,970 filed on May 3, 2017, which is a continuation in part of PCT/CN2015/093707 filed on Nov. 3, 2015, which claims the benefit of priority from Chinese Patent Application Nos. CN 201510613258.3 filed on Sep. 23, 2015 and CN 201410613631.0 filed on Nov. 3, 2014.

TECHNICAL FIELD

The present invention belongs to the technical field of flow batteries, and more particularly relates to a method and system for monitoring state of charge (SOC) of a flow battery system, a flow battery based on a redundancy design of a SOC detection device, a method and device for determining an actual capacity of a flow battery, and a method and system for estimating an input-output characteristic of an alternating-current side of a flow battery.

BACKGROUND ART

A flow battery has become one of ideal choices of large-scale energy storage owing to its advantages, such as longevity, high safety, powerful over-charging and over-discharging capacities and environmental friendliness, and mainly functions in application markets including renewable energy source power stations, user side smart microgrids (in residential areas, industrial areas and communal facilities), etc. Correspondingly, the flow battery system has multiple functions, i.e., utilizing valley electricity in peaks, balancing loads, improving the quality of electric energy, etc.

A state of charge (SOC) is a parameter reflecting the status of electric energy stored in a battery, is the most direct basis for a battery system to realize accurate control and management, and is also one of the most important parameters of the flow battery. The real-time and accurate SOC plays critical roles in guaranteeing high reliability operation of the battery system, improving the service effect of the battery and prolonging the life of the battery. In order to ensure effective control and management of the flow battery and achievement of favorable charging and discharging performances and long service life, it is necessary to detect SOC of the flow battery and record real and accurate SOC values at all times, and further control the flow battery to execute corresponding operating strategies according to the values, e.g., adjusting electrolyte flow, changing charging and discharging modes, etc. Furthermore, a battery management system also further feeds back the obtained SOC values to a overall energy management system to provide important references and basis for scheduling thereof. That is to say, the degree of accuracy (i.e., the deviation with a real value) of the SOC values obtained by SOC detection devices will directly affect the operating safety and stability of the flow battery, even a power station-level energy storage system.

State of charge (SOC) of the flow battery is learnt mainly by monitoring a real-time voltage difference between anode electrolyte and cathode electrolyte. The voltage difference is directly related to electrolyte concentration. In a working flow battery system, electrolyte in an anode electrolyte storage tank and electrolyte in a cathode electrolyte storage tank flow through an electrolyte circulating pipeline and the stack driven by a circulating pump, and undergo electrochemical reactions in the stack, such that the concentration of active components in the electrolytes entering the stack changes; then, the electrolytes return to the anode electrolyte storage tank and the cathode electrolyte storage tank and are mixed with electrolytes in the storage tanks, and therefore the voltage differences between the anode electrolyte and the cathode electrolyte of the flow battery in different locations are different, and accordingly, the voltage differences of electrolytes at any position of the flow battery, e.g., an stack inlet, a stack outlet as well as in the anode electrolyte storage tank and the cathode electrolyte storage tank cannot directly reflect real-time state of charge (SOC) of the flow battery; in general, state of charge (SOC) of the flow battery system in the prior art reflects the state of charge (SOC) of the whole flow battery system merely by monitoring a voltage difference between anode electrolyte and cathode electrolyte of the flow battery in a single position. Other numerous factors, such as power/capacity configuration and charging and discharging stages have not been taken into consideration yet. Such measurements are conducted according to unified standards, and real-time and accurate state of charge (SOC) cannot be monitored and calculated comprehensively and completely.

In addition, only one set of SOC detection devices is placed at a monitoring point in the prior art, which means that a battery management system cannot judge whether the detected SOC value is an accurate valve because of lack of reference data for comparison, when the SOC detection device is damaged, and it is possible to cause serious affects on the operating safety and stability of a flow battery body and a power station-level energy storage system in case of controlling and scheduling the flow battery based on inaccurate SOC value. Specifically, in cases of electrolyte leakage and blockage, the imprecisions of a potential sensor or a voltage sensor in a monitoring position in the SOC detection devices, it is possible to cause a greater deviation between the SOC fed back between the SOC detection device and the real value. It is known based on information gathered from multiple megawatt-level flow battery projects domestically and abroad at present that the differences between the SOC value measured by the SOC detection device to the battery management system and the real SOC value even exceeds 10% in some cases. When the SOC detection device feeds back the inaccurate SOC value to the battery management system and a high-level energy management system, the inaccurate SOC value at least would affect subsequent operation and management of the flow battery, and in more serious cases will cause the situation that a scheduling instruction significantly fails to conform to the real state of the flow battery, thus causing forceful over-charging and over-discharging of the flow battery and seriously affecting the operating efficiency and stability of the whole energy storage system, and the phenomena, such as significant reduction of capacity and performance of the battery system, stack burnout and failure to continuous work of the battery system will occur if this case continues in this way.

In actual operations, an electrical power system or a high-level scheduling system pays closer attention to actual chargeable and dischargeable capacities of the battery system. When some operating parameters of the flow battery, such as temperature, operating mode, electrolyte flow and electrolyte temperature are off specifications, SOC obtained by the SOC detection device does not directly reflect the electric quantity actually dischargeable from the flow battery, and if SOC is simply used for reflecting chargeable and dischargeable capacities, it would cause inaccurate scheduling and over-charging/over-discharging of the flow battery, or misjudgment of the scheduling system and the like, thereby seriously affecting the operating efficiency and stability of the whole energy storage system and a power station.

Furthermore, the input-output characteristic of an alternating-current side of a flow battery is one of the problems that people concern, and is a premise that a user can use the flow battery favorably and accurately. But, the flow battery itself has a magnetic drive pump, a heat exchange system, a ventilation system, a battery management system, a sensor and other auxiliary power consumptions, and for the flow battery, when it is charged or discharged, it is necessary to provide extra power consumption and energy to drive the auxiliary power consumptions to run, such that the input-output characteristic of the alternating-current side of the flow battery is significantly different from that of the traditional storage battery; secondly, self-discharging of the flow battery is also significantly different from that of the traditional battery, and is less affected by time, but greatly affected by a capacity-to-power ratio; finally, the same as the conventional storage battery, the flow battery also refers to the alternating-current/direct-current conversion efficiency of an energy storage inverter and a transformer. The above factors determines that the input-output characteristic of the alternating-current side of the flow battery cannot be estimated accurately, e.g., under the current system state and under different operating modes, what is the maximum power that the alternating-current side can bear and what is the maximum energy capable of being charged or discharged by the alternating-current side are often more concerned by users.

SUMMARY OF THE INVENTION

The present invention develops a method and system for monitoring state of charge (SOC) of a flow battery system, a flow battery based on a redundancy design of a SOC detection device, a method and device for determining an actual capacity of a flow battery, and a method and system for estimating an input-output characteristic of an alternating-current side of a flow battery, over the rise of the above problems.

The technical means of the present invention is as follows:

A method for monitoring state of charge (SOC) of a flow battery system, the flow battery system comprises a stack, an anode electrolyte storage tank, a cathode electrolyte storage tank and an electrolyte circulating pipeline, the monitoring method comprises the following steps:

Step 1: determining SOCs of at least two pairs of different monitoring positions, any pair of monitoring positions being as followings: an inside of the anode electrolyte storage tank and an inside of the cathode electrolyte storage tank, inside an anode electrolyte outlet pipeline of the stack and inside a cathode electrolyte outlet pipeline of the stack, or inside an anode electrolyte inlet pipeline of the stack and inside a cathode electrolyte inlet pipeline of the stack;

Step 2: according to the SOCs respectively corresponding to each pair of monitoring positions, acquiring a $SOC_{sum}$ of a flow battery system.

Further, when three pairs of monitoring positions are present, the Step 2 is specifically as follows:

calculating the $SOC_{sum}$ of the flow battery system according to a formula $SOC_{sum}=A \times SOC_a+B \times SOC_b+C \times SOC_c$, wherein A, B and C are coefficients, and $A+B+C=1$; $SOC_a$ is SOC corresponding to monitoring positions: the inside of the anode electrolyte storage tank and the inside of the cathode electrolyte storage tank; $SOC_b$ is SOC corresponding to monitoring positions: inside the anode electrolyte outlet pipeline of the stack and inside the cathode electrolyte outlet pipeline of the stack; $SOC_c$ is SOC corresponding to monitoring positions: inside the anode electrolyte inlet pipeline of the stack and inside the cathode electrolyte inlet pipeline of the stack.

Further, when two pairs of monitoring positions are present, the Step 2 is specifically as follows:

calculating the $SOC_{sum}$ of the flow battery system according to formulas $SOC_{sum}=A \times SOC_a+B \times SOC_b$, $SOC_{sum}=A \times SOC_a+C \times SOC_c$ or $SOC_{sum}=B \times SOC_b+C \times SOC_c$, wherein A, B and C are coefficients, and the sum of all coefficients in each formula is equal to 1; $SOC_a$ is SOC corresponding to monitoring positions: the inside of the anode electrolyte storage tank and the inside of the cathode electrolyte storage tank; $SOC_b$ is SOC corresponding to monitoring positions: inside the anode electrolyte outlet pipeline of the stack and inside the cathode electrolyte outlet pipeline of the stack; $SOC_c$ is SOC corresponding to monitoring positions: inside the anode electrolyte inlet pipeline of the stack and inside the cathode electrolyte inlet pipeline of the stack.

Further, before Step 2, the method further comprises the following step:

configuring coefficients A, B and C according to a ratio of a power to a capacity of the flow battery system.

Further, when three pairs of monitoring positions are present, the step of configuring coefficients A, B and C according to the ratio of the power to the capacity of the flow battery system is specifically as follows:

(1) determining whether the ratio of the power to the capacity of the flow battery system is larger than or equal to a first preset value, if so, executing Step (2), and if not, executing Step (3);

(2) configuring $0.1 \leq A \leq 0.3$, $0.5 \leq B \leq 0.8$, $0.1 \leq C \leq 0.3$, and executing Step 2;

(3) determining whether the ratio of the power to the capacity of the flow battery system is smaller than or equal to a second preset value, if so, executing Step (4), and if not, executing Step (5);

(4) configuring $0.1 \leq A \leq 0.3$, $0.1 \leq B \leq 0.3$, $0.5 \leq C \leq 0.8$, and executing Step 2;

(5) calculating a SOC average value $SOC_{average}$ of each pair of monitoring positions via $SOC_{average}=(SOC_a+SOC_b+SOC_c)/3$, and executing Step (6);

(6) when $0<SOC_{average} \leq 20\%$, configuring $0.1 \leq A \leq 0.33$, $0.33 \leq B \leq 0.6$ and $0.1 \leq C \leq 0.33$, and executing Step 2;

when $20\%<SOC_{average} \leq 80\%$, configuring $A=B=C$, and executing Step 2;

when $80\%<SOC_{average}<100\%$, configuring $0.1 \leq A \leq 0.33$, $0.1 \leq B \leq 0.33$ and $0.33 \leq C \leq 0.6$, and executing Step 2.

Further, when two pairs of monitoring positions are present, the step of configuring coefficients A, B and C according to the ratio of the power to the capacity of the flow battery system is specifically as follows:

i. determining whether the ratio of the power to the capacity of the flow battery system is larger than or equal to a first preset value, if so, executing Step ii, and if not, executing Step iii;

ii. with respect to a formula $SOC_{sum}=A \times SOC_a+B \times SOC_b$, configuring $0.1 \leq A \leq 0.3$ and $0.7 \leq B \leq 0.9$, and executing Step 2;

with respect to a formula $SOC_{sum}=A \times SOC_a+C \times SOC_c$, configuring $0.4 \leq A \leq 0.5$ and $0.5 \leq C \leq 0.6$, and executing Step 2;

with respect to a formula $SOC_{sum}=B \times SOC_b+C \times SOC_c$, configuring $0.7 \leq B \leq 0.9$ and $0.1 \leq C \leq 0.3$, and executing Step 2;

iii. determining whether the ratio of the power to the capacity of the flow battery system is smaller than or equal to a second preset value, if so, executing Step iv, and if not, executing Step v;

iv. with respect to a formula $SOC_{sum}=A \times SOC_a+B \times SOC_b$, configuring $0.4 \leq A \leq 0.5$ and $0.5 \leq B \leq 0.6$, and executing Step 2;

with respect to a formula $SOC_{sum}=A \times SOC_a+C \times SOC_c$, configuring $0.1 \leq A \leq 0.3$ and $0.7 \leq C \leq 0.9$, and executing Step 2;

with respect to a formula $SOC_{sum}=B \times SOC_b+C \times SOC_c$, configuring $0.1 \leq B \leq 0.3$ and $0.7 \leq C \leq 0.9$, and executing Step 2;

v. calculating a SOC mean $SOC_{mean}$ of any two pairs of monitoring positions via $SOC_{mean}=(SOC_a+SOC_b)/2$, $SOC_{mean}=(SOC_a+SOC_c)/2$ or $SOC_{mean}=(SOC_b+SOC_c)/2$ and executing Step vi;

vi. when $0<SOC_{mean} \leq 20\%$:

with respect to a formula $SOC_{sum}==A \times SOC_a+B \times SOC_b$, configuring $0.2 \leq A \leq 0.5$ and $0.5 \leq B \leq 0.8$, and executing Step 2;

with respect to a formula $SOC_{sum}==A \times SOC_a+C \times SOC_c$, configuring $0.4 \leq A \leq 0.5$ and $0.5 \leq C \leq 0.6$, and executing Step 2;

with respect to a formula $SOC_{sum}=B \times SOC_b+C \times SOC_c$, configuring $0.5 \leq B \leq 0.8$ and $0.2 \leq C \leq 0.5$, and executing Step 2;

when $20\%<SOC_{mean} \leq 80\%$, configuring A=B=C;

when $80\%<SOC_{mean}<100\%$:

with respect to a formula $SOC_{sum}==A \times SOC_a+B \times SOC_b$, configuring $0.4 \leq A \leq 0.5$ and $0.5 \leq B \leq 0.6$, and executing Step 2;

with respect to a formula $SOC_{sum}=A \times SOC_a+C \times SOC_c$, configuring $0.2 \leq A \leq 0.5$ and $0.5 \leq C \leq 0.8$, and executing Step 2;

with respect to a formula $SOC_{sum}==B \times SOC_b+C \times SOC_c$, configuring $0.2 \leq B \leq 0.5$ and $0.5 \leq C \leq 0.8$, and executing Step 2.

A system for monitoring state of charge (SOC) of a flow battery system, the flow battery system comprising a stack, an anode electrolyte storage tank, a cathode electrolyte storage tank and an electrolyte circulating pipeline, the monitoring system comprises:

a monitoring device configured to determine SOCs of at least two pairs of different monitoring positions, any pair of monitoring positions being as followings: an inside of the anode electrolyte storage tank and an inside of the cathode electrolyte storage tank, on an anode electrolyte outlet pipeline of the stack and on a cathode electrolyte outlet pipeline of the stack, or on an anode electrolyte inlet pipeline of the stack and on a cathode electrolyte inlet pipeline of the stack.

In addition, the monitoring system further comprises a connection monitoring device, and a SOC acquisition module configured to acquire state of charge $SOC_{sum}$ of the flow battery system according to SOCs respectively corresponding to each pair of the monitoring positions.

Further, when three pairs of monitoring positions are present, the SOC acquisition module acquires state of charge $SOC_{sum}$ of the flow battery system using a formula $SOC_{sum}=A \times SOC_a+B \times SOC_b+C \times SOC_c$, wherein, A, B and Care coefficients, and A+B+C=1; $SOC_a$ is SOC corresponding to monitoring positions: the inside of the anode electrolyte storage tank and the inside of the cathode electrolyte storage tank; $SOC_b$ is SOC corresponding to monitoring positions: inside the anode electrolyte outlet pipeline of the stack and inside the cathode electrolyte outlet pipeline of the stack; $SOC_c$ is SOC corresponding to monitoring positions: inside the anode electrolyte inlet pipeline of the stack and inside the cathode electrolyte inlet pipeline of the stack.

Further, when two pairs of monitoring positions are present, the SOC acquisition module acquires $SOC_{sum}$ of the flow battery system using the formula $SOC_{sum}=A \times SOC_a+B \times SOC_b$, the formula $SOC_{sum}=A \times SOC_a+C \times SOC_c$, or formula $SOC_{sum}=B \times SOC_b+C \times SOC_c$, wherein, A, B and Care coefficients, and the sum of all the coefficients in each formula is equal to 1; $SOC_a$ is SOC corresponding to monitoring positions: the inside of the anode electrolyte storage tank and the inside of the cathode electrolyte storage tank; $SOC_b$ is SOC corresponding to monitoring positions: inside the anode electrolyte outlet pipeline of the stack and inside the cathode electrolyte outlet pipeline of the stack; $SOC_c$ is SOC corresponding to monitoring positions: inside the anode electrolyte inlet pipeline of the stack and inside the cathode electrolyte inlet pipeline of the stack.

A flow battery based on a redundancy design of SOC detection devices, wherein at least two pairs of SOC detection devices are provided in the same monitoring position; the monitoring positions refer to anyone pair of positions being as followings: an inside of the anode electrolyte storage tank and an inside of the cathode electrolyte storage tank, on the anode electrolyte outlet pipeline of the stack and on the cathode electrolyte outlet pipeline of the stack, or on the anode electrolyte inlet pipeline of the stack and on the cathode electrolyte inlet pipeline of the stack.

Further, the SOC detection devices can be connected in series or in parallel.

Further, the flow battery further comprises a battery management system, the battery management system comprising:

a SOC calculation module configured to obtain a SOC value corresponding to each SOC detection device according to a signal detected by the SOC detection device which is in an operating state;

a SOC fault judgment module configured to compare the calculated SOC values, and determine the SOC detection device which is in a faulty state;

a SOC fault elimination module configured to execute a closing operation of valves at two ends of the SOC detection device which is in a faulty state.

Further, the SOC fault judgment module is configured to determine the SOC detection device which is in a faulty state according to a preset fault judgment program, the preset fault judgment program including:

when more than two pairs of SOC detection devices are in an operating state, a working mode of the SOC fault judgment module is as follows:

performing difference-making comparison on each SOC value obtained by calculation and other SOC value, if a difference between the current SOC value and other SOC value is larger than a set fault threshold $Y^1$, then determining that the SOC detection device corresponding to the current SOC value has a fault, and starting the SOC fault elimination module;

when two pairs of SOC detection devices are in an operating state, a working mode of the SOC fault judgment module is as follows:

determining whether an open-circuit voltage of the two pairs of SOC detection devices is within a set fault threshold $Y^2$, if the voltage of the current SOC detection devices is not within the fault threshold $Y^2$, then determining that the current SOC detection device is in a faulty state, and starting the SOC fault elimination module.

Further, after the SOC fault elimination module is started, the SOC calculation module recalculates SOCs, and the SOC fault judgment module continued to compare the calculated SOC values and redetermine the SOC detection device which is in a faulty state.

Further:

the flow battery is provided with at least N pairs of mutually redundant SOC detection devices at the same monitoring position, wherein N−M pairs of SOC detection devices are in an operating state, and M pairs of SOC detection devices are in a standby state, where 2≤N−M<N, N≥3.

Further:

the battery management system further comprises a state switching module; the state switching module controls standby SOC detection devices to realize switching between a standby state and an operating state.

Further:

after the SOC fault elimination module eliminates a closing operation of two valves at two ends of the faulty SOC detection device, the state switching module of the battery management system automatically controls valves at two ends of the standby detection device to be opened and switches the standby SOC detection device from a standby state to an operating state.

A method for determining an actual capacity of a flow battery, comprising the following steps:

Step 1: acquiring state of charge $SOC_{sum}$ of the flow battery system by means of the method for monitoring state of charge (SOC) of the flow battery system according to any one of claims, and taking $SOC_{sum}$ as SOC of the flow battery;

Step 2: learning current operating state parameters of the flow battery;

Step 3: determining the actual capacity of the flow battery according to the acquired SOC of the flow battery and the learnt current operating state parameters of the flow battery and in combination with the corresponding relationship among the actual capacity of the flow capacity, and SOC of the flow battery and the operating state parameters of the flow battery.

Further, the actual capacity of the flow battery specifically includes an actual dischargeable capacity of the flow battery; the operating state parameters of the flow battery at least include: a ratio of a discharge power to a rated power, electrolyte temperature and electrolyte flow; the corresponding relationship among the actual dischargeable capacity of the flow battery, and SOC of the flow battery and the operating state parameters of the flow battery is $C_d=C_r \times R_{(SOC,P)} \times R_{(T,P)} \times R_{(F,P)}$, wherein $C_d$ is the actual dischargeable capacity of the flow battery; $C_r$ the rated discharge capacity of the flow battery; $R_{(SOC,P)}$ is a ratio of the actual dischargeable capacity of the flow battery to the rated discharge capacity of the flow battery under the conditions of different SOCs of the flow battery and different ratios of the discharge power of the flow battery to the rated power of the flow battery; $R_{(T,P)}$ is a ratio of the actual dischargeable capacity of the flow battery to the rated discharge capacity of the flow battery under the conditions of different electrolyte temperatures and different ratios of the discharge power of the flow battery and the rated power of the flow battery; $R_{(F,P)}$ is a ratio of the actual dischargeable capacity of the flow battery to the rated discharge capacity of the flow battery under the conditions of different electrolyte flows and different ratios of the discharge power of the flow battery to the rated power of the flow battery.

Further, the actual capacity of the flow battery further includes an actual chargeable capacity of the flow battery; the operating state parameters of the flow battery further include: a ratio of a charge power to a rated power; the corresponding relationship among the actual chargeable capacity of the flow battery, and SOC of the flow battery and the operating state parameters of the flow battery is $C_c=C'_r \times R'_{(SOC,P)} \times R'_{(T,P)} \times R'_{(F,P)}$, wherein $C_c$ is the actual chargeable capacity of the flow battery; $C'_r$ is the rated charge capacity of the flow battery; $R'_{(SOC,P)}$ is a ratio of the actual chargeable capacity of the flow battery to the rated charge capacity of the flow battery under the conditions of different SOCs of the flow battery and different ratios of the charge power of the flow battery to the rated power of the flow battery; $R'_{(T,P)}$ is a ratio of the actual chargeable capacity of the flow battery to the rated charge capacity of the flow battery under the conditions of different electrolyte temperatures and different ratios of the charge power of the flow battery to the rated power of the flow battery; $R'_{(F,P)}$ is a ratio of the actual chargeable capacity of the flow battery to the rated charge capacity of the flow battery under the conditions of different electrolyte flows and different ratios of the charge power of the flow battery to the rated power of the flow battery.

Further, the operating state parameters of the flow battery further include at least one of an operating mode of the flowing battery, ambient temperature, electrolyte pressure, liquid level difference of electrolyte in the anode electrolyte storage tank and the cathode electrolyte storage tank, and electrolyte concentration.

Further, the method comprises: pre-storing ratios of the actual dischargeable capacity to the rated discharge capacity of the flow battery operating under the conditions of different SOCs and different ratios of the discharge power to the rated power in advance; pre-storing ratios of the actual dischargeable capacity to the rated discharge capacity of the flow battery operating under the conditions of different electrolyte temperatures and different ratios of the discharge power and the rated power in advance; pre-storing ratios of the actual dischargeable capacity to the rated discharge capacity of the flow battery operating under the conditions of different electrolyte flows and different ratios of the discharge power to the rated power in advance; pre-storing ratios of the actual chargeable capacity to the rated charge capacity of the flow battery operating under the conditions of different SOCs and different ratios of the charge power to the rated power in advance; pre-storing ratios of the actual chargeable capacity to the rated charge capacity of the flow battery operating under the conditions of different electrolyte temperatures and different ratios of the charge power to the rated power in advance; pre-storing ratios of the actual chargeable capacity to the rated charge capacity of the flow battery operating under the conditions of different electrolyte flows and different ratios of the charge power to the rated power in advance.

Further, the Step 3 is specifically as follows: determining corresponding parameters $R_{(SOC,P)}$, $R_{(T,P)}$ and $R_{(F,P)}$ according to the acquired SOC of the flow battery, the ratio of the current discharge power to the rated power of the flow battery, the electrolyte temperature and the electrolyte flow, and further obtaining the actual dischargeable capacity $C_d$ of the flow battery in combination with $C_d=C_r \times R_{(SOC,P)} \times R_{(T,P)} \times R_{(F,P)}$; determining corresponding parameters $R'_{(SOC,P)}$, $R'_{(T,P)}$ and $R'_{(F,P)}$ according to the acquired SOC of the flow battery, and the ratio of the current charge power to the rated power of the flow battery, the electrolyte temperature and the electrolyte flow, and further obtaining the actual chargeable capacity $C_c$ of the flow battery in combination with $C_c=C'_r\times R'_{(SOC,P)}\times R'_{(T,P)}\times R'_{(F,P)}$.

A device for determining an actual capacity of a flow battery, comprises:

the state of charge (SOC) state monitoring system of the flow battery system according to any one of the above claims;

a parameter learning module configured to learn current operating state parameters of the flow battery;

an actual capacity determination module which is connected with the state of charge (SOC) monitoring system and the parameter learning module of the flow battery system; the state of charge $SOC_{sum}$ of the flow battery system acquired by the SOC acquisition module included in the SOC state monitoring system of the flow battery system serves as SOC of the flow battery; the actual capacity determination module is configured to determine the actual capacity of the flow battery according to the acquired SOC of the flow battery and the learnt current operating state parameters of the flow battery and in combination with the corresponding relationship among the actual capacity of the flow battery, and SOC of the flow battery and the operating state parameters of the flow battery.

Further, the actual capacity of the flow battery specifically includes an actual dischargeable capacity of the flow battery; the operating state parameters of the flow battery at least include: a ratio of a discharge power to a rated power, electrolyte temperature and electrolyte flow; the corresponding relationship among the actual dischargeable capacity of the flow battery, and SOC of the flow battery and the operating state parameters of the flow battery is $C_d=C_r\times R_{(SOC,P)}\times R_{(T,P)}\times R_{(F,P)}$, wherein $C_d$ is the actual dischargeable capacity of the flow battery; $C_r$ the rated discharge capacity of the flow battery; $R_{(SOC,P)}$ is a ratio of the actual dischargeable capacity of the flow battery to the rated discharge capacity of the flow battery under the conditions of different SOCs of the flow battery and different ratios of the discharge power of the flow battery to the rated power of the flow battery; $R_{(T,P)}$ is a ratio of the actual dischargeable capacity of the flow battery to the rated discharge capacity of the flow battery under the conditions of different electrolyte temperatures and different ratios of the discharge power of the flow battery to the rated power of the flow battery; $R_{(F,P)}$ is a ratio of the actual dischargeable capacity of the flow battery to the rated discharge capacity of the flow battery under the conditions of different electrolyte flows and different ratios of the discharge power of the flow battery to the rated power of the flow battery.

Further, the actual capacity of the flow battery further includes an actual chargeable capacity of the flow battery; the operating state parameters of the flow battery at least include: a ratio of a charge power to a rated power; the corresponding relationship among the actual chargeable capacity of the flow battery, and SOC of the flow battery and the operating state parameters of the flow battery is $C_c=C'_r\times R'_{(SOC,P)}\times R'_{(T,P)}\times R'_{(F,P)}$, wherein $C_c$ is the actual chargeable capacity of the flow battery; $C'_r$ is the rated charge capacity of the flow battery; $R'_{(SOC,P)}$ is a ratio of the actual chargeable capacity of the flow battery to the rated charge capacity of the flow battery under the conditions of different SOCs of the flow battery and different ratios of the charge power of the flow battery to the rated power of the flow battery; $R'_{(T,P)}$ is a ratio of the actual chargeable capacity of the flow battery to the rated charge capacity of the flow battery under the conditions of different electrolyte temperatures and different ratios of the charge power of the flow battery to the rated power of the flow battery; $R'_{(F,P)}$ is a ratio of the actual chargeable capacity of the flow battery to the rated charge capacity of the flow battery under the conditions of different electrolyte flows and different ratios of the charge power of the flow battery to the rated power of the flow battery.

Further, the operating state parameters of the flow battery further include at least one of an operating mode of the flowing battery, ambient temperature, electrolyte pressure, liquid level difference of electrolyte in the anode electrolyte storage tank and the cathode electrolyte storage tank, and electrolyte concentration.

Further, the determination device further comprises a storage module connected with the actual capacity determination module; the storage module is configured to pre-store ratios of the actual dischargeable capacity to the rated discharge capacity of the flow battery operating under the conditions of different SOCs and different ratios of the discharge power to the rated power in advance; pre-store ratios of the actual dischargeable capacity to the rated discharge capacity of the flow battery operating under the conditions of different electrolyte temperatures and different ratios of the discharge power to the rated power in advance; pre-store ratios of the actual dischargeable capacity to the rated discharge capacity of the flow battery operating under the conditions of different electrolyte flows and different ratios of the discharge power to the rated power in advance; pre-store ratios of the actual chargeable capacity to the rated charge capacity of the flow battery operating under the conditions of different SOCs and different ratios of the charge power to the rated power in advance; pre-store ratios of the actual chargeable capacity to the rated charge capacity of the flow battery operating under the conditions of different electrolyte temperatures and different ratios of the charge power to the rated power in advance; and pre-store ratios of the actual chargeable capacity to the rated charge capacity of the flow battery operating under the conditions of different electrolyte flows and different ratios of the charge power to the rated power in advance.

Further, the actual capacity determination module is configured to determine corresponding parameters $R_{(SOC,P)}$, $R_{(T,P)}$ and $R_{(F,P)}$ according to the acquired SOC of the flow battery, the ratio of the current discharge power to therated power of the flow battery, the electrolyte temperature and the electrolyte flow, and further obtain the actual dischargeable capacity $C_d$ of the flow battery in combination with $C_c=C'_r\times R'_{(SOC,P)}\times R'_{(T,P)}\times R'_{(F,P)}$; the actual capacity determination module is configured to determine corresponding parameters $R'_{(SOC,P)}$, $R'_{(T,P)}$ and $R'_{(F,P)}$ according to the acquired SOC of the flow battery, and the ratio of the current charge power to the rated power of the flow battery, the electrolyte temperature and the electrolyte flow, and further obtains the actual chargeable capacity $C_c$ of the flow battery in combination with $C_c=C'_r\times R'_{(SOC,P)}\times R'_{(T,P)}\times R'_{(F,P)}$.

A method for estimating an input-output characteristic of an alternating-current side of a flow battery, wherein an output end of the flow battery is connected with one end of an energy storage inverter with or without the help of direct-current transformation equipment, the other end of the energy storage inverter is connected with an alternating-current bus with or without the help of alternating-current transformation equipment, and a junction between the energy storage inverter and the alternating-current bus or a junction between the alternating-current transformation equipment and the alternating-current bus is taken as the alternating-current side of the flow battery, the estimation method comprises the following steps:

determining an actual capacity of the flow battery according to the method for determining an actual capacity of a flow battery according to the above claim;

obtaining an electric quantity actually supplied or absorbed by the alternating-current side of the flow battery according to the efficiency of the direct-current transformation equipment, the alternating-current/direct-current conversion efficiency of the energy storage inverter, the efficiency of the alternating-current transformation equipment, auxiliary energy consumption of the flow battery, and the determined actual capacity of the flow battery.

Further, the electric quantity actually absorbed by the alternating-current side of the flow battery is acquired according to $E_{ACI}=C_c/(TE_1 \times TE_2 \times TE_3)+EC_A/TE_3$ and the electric quantity actually supplied by the alternating-current side of the flow battery is acquired according to $E_{ACO}=C_d \times (TE_1 \times TE_2 \times TE_3)-EC_A \times TE_3$, wherein $E_{ACO}$ is the electric quantity actually supplied by the alternating-current side when the flow battery is discharged, $E_{ACI}$ is the electric quantity actually absorbed by the alternating-current side when the flow battery is charged, $C_c$ is the actual chargeable capacity of the flow battery, $C_d$ is the actual dischargeable capacity of the flow battery, $TE_1$ is the efficiency of the direct-current transformation equipment, $TE_2$ is the alternating-current/direct-current conversion efficiency of the energy storage inverter, $TE_3$ is the efficiency of the alternating-current transformation equipment, and $EC_A$ is auxiliary energy consumption of the flow battery.

Further, the estimation method further comprises the following steps:

calculating SOC at the alternating-current side of the flow battery vial $100\%-E_{ACI}/E'_R$ when the flow battery is charged; calculating SOC at the alternating-current side of the flow battery via $E_{ACO}/E_R$ when the flow battery is discharged; wherein $E'_R$ is the rated electric quantity absorbed by the alternating-current side of the flow battery, and $E_R$ is the rated electric quantity discharged by the alternating-current side of the flow battery.

Further, the power actually supplied by the alternating-current side of the flow battery is acquired according to $P_{ACO}=P_{LF} \times (TE_1 \times TE_2 \times TE_3)-EC_A \times TE_3$, and the power actually absorbed by the alternating-current side of the flow battery according to $P_{ACI}=P_{LC}/(TE_1 \times TE_2 \times TE_3)+EC_A/TE_3$, wherein $P_{ACO}$ is the power actually supplied by the alternating-current side of the flow battery, $P_{ACI}$ is the power actually absorbed by the alternating-current side of the flow battery, $P_{LC}$ is the charge power of the flow battery, $TE_1$ is the efficiency of the direct-current transformation equipment, $TE_2$ is the alternating-current/direct-current conversion efficiency of the energy storage inverter, $TE_3$ is the efficiency of the alternating-current transformation equipment, $EC_A$ is the auxiliary energy consumption of the flow battery, and $P_{LF}$ is the discharge power of the flow battery; when the power $P_{ACO}$ actually supplied by the alternating-current side of the flow battery or the power $P_{ACI}$ actually absorbed by the alternating-current side of the flow battery is a known quantity predetermined according to user's requirements, the corresponding charge power $P_{LC}$ of the flow battery or discharge power $P_{LF}$ of the flow battery can be further acquired.

Further, determining whether the power at the alternating-current side of the flow battery changes frequently, and when the power at the alternating-current side of the flow battery changes frequently, if SOC of the flow battery is larger than or equal to a SOC threshold, calculating the electric quantity actually absorbed by the alternating-current side according to $E_{ACI}=C_c/(TE_1 \times TE_2 \times TE_3)+EC_A/TE_3$ when the flow battery is charged, then calculating SOC at the alternating-current side of the flow battery via $100\%-E_{ACI}/E'_R$ When the flow battery is charged; if the SOC of the flow battery is smaller than the SOC threshold, calculating the electric quantity actually supplied by the alternating-current side according to $E_{ACO}=C_d \times (TE_1 \times TE_2 \times TE_3)-EC_A \times TE_3$ first when the flow battery is discharged, and then calculating SOC at the alternating-current side of the flow battery via $E_{ACO}/E_R$ when the flow battery is discharged.

Further, determining whether the power at the alternating-current side of the flow battery changes frequently by determining whether a time interval between the changed powers at the alternating-current side of the flow battery is lower than a preset time interval.

A system for estimating an input-output characteristic of an alternating-current side of a flow battery, wherein an output end of the flow battery is connected with one end of an energy storage inverter with or without the help of direct-current transformation equipment, the other end of the energy storage inverter is connected with an alternating-current bus with or without the help of alternating-current transformation equipment, and a junction between the energy storage inverter and the alternating-current bus or a junction between the alternating-current transformation equipment and the alternating-current bus is taken as the alternating-current side of the flow battery, the estimation system comprises:

the device for determining the actual capacity of the flow battery according to the above claim;

an estimation module connected with the device for determining the actual capacity of the flow battery and configured to determine an electric quantity actually supplied or absorbed by the alternating-current side of the flow battery according to the efficiency of the direct-current transformation equipment, the alternating-current/direct-current conversion efficiency of the energy storage inverter, the efficiency of the alternating-current transformation equipment, auxiliary energy consumption of the flow battery, and the determined actual capacity of the flow battery.

Further, the estimation module is configured to acquire an electric quantity actually supplied by the alternating-current side of the flow battery according to $E_{ACO}=C_d \times (TE_1 \times TE_2 \times TE_3)-EC_A \times TE_3$ and an electric quantity actually absorbed by the alternating-current side of the flow battery according to $E_{ACI}=C_c/(TE_1 \times TE_2 \times TE_3)+EC_A/TE_3$, wherein $E_{ACO}$ is the electric quantity actually supplied by the alternating-current side when the flow battery is discharged, $E_{ACI}$ is the electric quantity actually absorbed by the alternating-current side when the flow battery is charged, $C_c$ is the actual chargeable capacity of the flow battery, $C_d$ is the actual dischargeable capacity of the flow battery, $TE_1$ is the efficiency of the direct-current transformation equipment, $TE_2$ is the alternating-current/direct-current conversion efficiency of the energy storage inverter, $TE_3$ is the efficiency of the alternating-current transformation equipment, and $EC_A$ is the auxiliary energy consumption of the flow battery.

Further, the estimation module is configured to acquire SOC at the alternating-current side of the flow battery via $100\%-E_{ACI}/E'_R$ when the flow battery is charged; acquire SOC at the alternating-current side of the flow battery via $E_{ACO}/E_R$ when the flow battery is discharged, wherein $E'_R$ is the rated electric quantity absorbed by the alternating-current side of the flow battery, and $E_R$ is the rated electric quantity discharged by the alternating-current side of the flow battery.

Further, the power actually supplied by the alternating-current side of the flow battery is required according to $P_{ACO}=P_{LF}\times(TE_1\times TE_2\times TE_3)-EC_A\times TE_3$, and the power actually absorbed by the alternating-current side of the flow battery is acquired according to $P_{ACI}=P_{LC}/(TE_1\times TE_2\times TE_3)+EC_A/TE_3$, wherein $P_{ACO}$ is the power actually supplied by the alternating-current side of the flow battery, $P_{ACI}$ is the power actually absorbed by the alternating-current side of the flow battery, $P_{LC}$ is the charge power of the flow battery, $TE_1$ is the efficiency of the direct-current transformation equipment, $TE_2$ is the alternating-current/direct-current conversion efficiency of the energy storage inverter, $TE_3$ is the efficiency of the alternating-current transformation equipment, $EC_A$ is the auxiliary energy consumption of the flow battery, and $P_{LF}$ is the discharge power of the flow battery; when the power $P_{ACO}$ actually supplied by the alternating-current side of the flow battery or the power PCI actually absorbed by the alternating-current side of the flow battery is a known quantity predetermined according to user's requirements, the corresponding charge power $P_{LC}$ of the flow battery or the discharge power $P_{LF}$ of the flow battery can be further acquired.

Further, the estimation system further comprises a power change judgment module configured to judge whether the power at the alternating-current side of the flow battery changes frequently and a comparison module configured to compare SOC of the flow battery with a SOC threshold; when the power at the alternating-current side of the flow battery changes frequently, if SOC of the flow battery is larger than or equal to a SOC threshold, the electric quantity actually absorbed by the alternating-current side is acquired according to $E_{ACI}=C_c/(TE_1\times TE_2\times TE_3)+EC_A/TE_3$ when the flow battery is charged, and then SOC at the alternating-current side of the flow battery is acquired via $100\%-E_{ACI}/E'_R$ when the flow battery is charged; if the SOC of the flow battery is smaller than the SOC threshold, the electric quantity actually supplied by the alternating-current side is acquired according to $E_{ACO}=C_d\times(TE_1\times TE_2\times TE_3)-EC_A\times TE_3$ first when the flow battery is discharged, and then SOC at the alternating-current side of the flow battery is acquired via $E_{ACO}/E_R$ when the flow battery is discharged.

Further, the power change judgment module is configured to determine whether the power at the alternating-current side of the flow battery changes frequently by determining whether a time interval between the changed powers at the alternating-current side of the flow battery is lower than a preset time interval.

Compared with the prior art, the method and system for monitoring state of charge (SOC) of a flow battery system, the flow battery based on a redundancy design of a SOC detection device, the method and device for determining an actual capacity of a flow battery, and the method and system for estimating an input-output characteristic of an alternating-current side of an flow battery have the following beneficial effects:

1. state of charge (SOC) of the flow battery system is further acquired by integrating SOCs of the flow battery system at a plurality of monitoring positions, such that a monitoring result of the state of charge (SOC) is closer to a real numerical value, has the characteristics of accuracy and comprehensiveness in monitoring and convenience in real-time learning of state of charge (SOC) of the flow battery system at different positions and realizes the redundancy of SOC measurement; in addition, monitoring devices provided at some monitoring positions can still ensure real-time acquisition of a SOC monitoring result in case of having a fault, thereby being conductive to improving the service efficiency of the flow battery, prolonging the service life of the battery and accurately managing the flow battery system;

2. whether the SOC detection value obtained by the battery management system is accurate can be judged fast, the operation of the faulty SOC detection device can be halted fast, the problems that the existing SOC detection numerical value is prone to lose efficiency and is not accurate are effectively solved, it is guaranteed that the SOC value monitored during the overall operating process of the flow battery is always a referable accurate value, the service life of the flow battery is prolonged, and the safe and stable operation capability of the flow battery is improved; it is unnecessary to halt the flow battery in a process of replacing and maintaining the SOC detection device, but SOC detection is not suspended, such that normal operation and scheduling of the flow battery are ensured, the halt frequency of the flow battery is greatly reduced, and the operation efficiency and the output capability of the flow battery are improved; it is guaranteed that the battery management system and a superior energy management system can receive accurate SOC values at any moment, the possibility of executing faulty operations because of referring to invalid SOC values is greatly reduced, safe management and scheduling of the flow battery are achieved, effects of failure of normal output of the flow battery on other equipment (such as inverters, power generation equipment and electrical load) of an energy storage power station are reduced, and the overall safety and stability of the energy storage power station and a power grid system are improved;

3. the relationship between SOC and various operating parameters of the flow battery are effectively sorted out, the real-time uniformity of SOC and the dischargeable capacity of the flow battery is ensured, accurate determination of the actual capacity of the flow battery at any moment and under any state can be realized, the problems, such as scheduling instruction mismatching, over-charging/over-discharging, even misjudgment of a scheduling system, resulted from scheduling the flow battery by the energy management system just by reference to single SOC state are fundamentally avoided in actual applications, and the scheduling accuracy and the fast response capability of the flow battery, as well as the operation efficiency and stability of the energy system and the power station are effectively improved.

4. a method capable of estimating an input-output characteristic of an alternating-current side of a flow battery accurately is obtained by taking the effects of the auxiliary equipment, inversion equipment and transformation equipment of the flow battery on energy and efficiency of a direct-current side and the alternating-current side of the flow battery into full consideration, to provide more accurate, detailed and referable guidance for a user to use the flow battery more reasonably. The method is simple and feasible, and has great application significance, favorable promotion and application values and important significance in promoting commercial and large-scale application of the flow battery.

BRIEF DESCRIPTION OF THE DRAWINGS

To better illustrate the technical solutions, drawings of embodiments of the current invention or prior art are provided below. One skilled in the art may be able to obtain variations of such embodiments without conducting creative work.

FIGS. 5-a, 5-b and 5-c are schematic drawings of redundant structures of different SOC detection devices according to the third embodiment of the present invention;

Reference symbols in drawings are as follows: 1. stack; 2. anode electrolyte storage tank; 3. cathode electrolyte storage tank; 4. potential monitoring device; 5. circulating pump; 6. anode electrolyte outlet pipeline of stack; 7. cathode electrolyte outlet pipeline of stack; 8. anode electrolyte inlet pipeline of stack; 9. cathode electrolyte inlet pipeline of stack; 10. SOC acquisition module; 11. SOC detection device; 41. first potential monitoring module; 42. second potential monitoring module; 43. potential difference acquisition module.

DETAILED DESCRIPTION OF THE PREFERRED EMBODIMENTS

In order to more clearly express the objective, technical solutions and advantages of embodiments of the present invention, the technical solutions in the examples of the invention will be described clearly and completely as below in conjunction with drawings for the embodiments of the present invention. The embodiments are merely exemplary and do not cover all embodiments of the invention.

The invention covers all embodiments that one skilled in the art may develop without conducting creative work.

Figure 1:
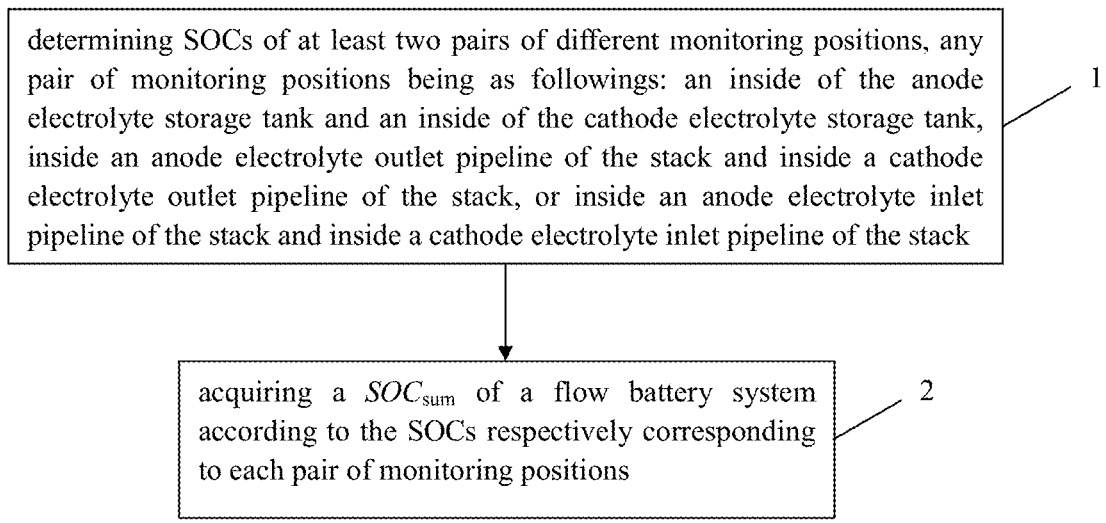
FIG. 1 is a flowchart representing a method for monitoring state of charge (SOC) of a flow battery system of the first embodiment of the present invention.

First, a method for monitoring state of charge (SOC) of a flow battery system according to the first embodiment of the present invention will be explained in combination with drawings. FIG. 1 shows a method for monitoring state of charge (SOC) of a flow battery system. The flow battery system includes a stack, an anode electrolyte storage tank, a cathode electrolyte storage tank and an electrolyte circulating pipeline. The monitoring method includes the following steps:

Step 1: determining SOCs of at least two pairs of different monitoring positions. Each pair of the monitoring positions may be chosen from at inside of the anode electrolyte storage tank and inside of the cathode electrolyte storage tank, inside an anode electrolyte outlet pipeline of the stack and inside a cathode electrolyte outlet pipeline of the stack, or inside an anode electrolyte inlet pipeline of the stack and inside a cathode electrolyte inlet pipeline of the stack;

Step 2: according to the SOCs respectively corresponding to each pair of monitoring positions, calculating a $SOC_{sum}$ of a flow battery system.

Preferably, when three pairs of monitoring positions are present, the Step 2 is specifically calculated as follows:

calculating the $SOC_{sum}$ of the flow battery system according to a formula $SOC_{sum}=A\times SOC_a+B\times SOC_b+C\times SOC_c$, wherein A, B and C are coefficients, and A+B+C=1; $SOC_a$ is SOC corresponding to monitoring positions: inside of the anode electrolyte storage tank and inside of the cathode electrolyte storage tank; $SOC_b$ is SOC corresponding to monitoring positions: inside the anode electrolyte outlet pipeline of the stack and inside the cathode electrolyte outlet pipeline of the stack; $SOC_c$ is SOC corresponding to monitoring positions: inside the anode electrolyte inlet pipeline of the stack and inside the cathode electrolyte inlet pipeline of the stack.

Preferably, when two pairs of monitoring positions are present, the Step 2 is specifically as follows:

calculating the $SOC_{sum}$ of the flow battery system according to formulas $SOC_{sum}=A\times SOC_a+B\times SOC_b$, $SOC_{sum}=A\times SOC_a+C\times SOC_c$ or $SOC_{sum}=B\times SOC_b+C\times SOC_c$, wherein A, B and C are coefficients, and the sum of all coefficients in each formula is equal to 1; $SOC_a$ is SOC corresponding to monitoring positions: inside of the anode electrolyte storage tank and inside of the cathode electrolyte storage tank; $SOC_b$ is SOC corresponding to monitoring positions: inside the anode electrolyte outlet pipeline of the stack and inside the cathode electrolyte outlet pipeline of the stack; $SOC_c$ is SOC corresponding to monitoring positions: inside the anode electrolyte inlet pipeline of the stack and inside the cathode electrolyte inlet pipeline of the stack.

Preferably, before Step 2, the method further comprises the following steps:

configuring coefficients A, B and C according to a ratio of a power to a capacity of the flow battery system.

Preferably, when three pairs of monitoring positions are present, the step of configuring coefficients A, B and C according to the ratio of the power to the capacity of the flow battery system is specifically as follows:

(1) determining whether the ratio of the power to the capacity of the flow battery system is larger than or equal to a first preset value, if so, executing Step (2), and if not, executing Step (3);

(2) configuring $0.1 \leq A \leq 0.3$, $0.5 \leq B \leq 0.8$, $0.1 \leq C \leq 0.3$, and executing Step 2;

(3) determining whether the ratio of the power to the capacity of the flow battery system is smaller than or equal to a second preset value, if so, executing Step (4), and if not, executing Step (5);

(4) configuring $0.1 \leq A \leq 0.3$, $0.1 \leq B \leq 0.3$, $0.5 \leq C \leq 0.8$, and executing Step 2;

(5) calculating a SOC average value $SOC_{average}$ of each pair of monitoring positions via $SOC_{average}=(SOC_a+SOC_b+SOC_c)/3$, and executing Step (6);

(6) when $0<SOC_{average} \leq 20\%$, configuring $0.1 \leq A \leq 0.33$, $0.33 \leq B \leq 0.6$ and $0.1 \leq C \leq 0.33$, and executing Step 2;

when $20\%<SOC_{average} \leq 80\%$, configuring $A=B=C$, and executing Step 2;

when $80\%<SOC_{average}<100\%$, configuring $0.1 \leq A \leq 0.33$, $0.1 \leq B \leq 0.33$ and $0.33 \leq C \leq 0.6$, and executing Step 2.

Preferably, when two pairs of monitoring positions are present, the step of configuring coefficients A, B and C according to the ratio of the power to the capacity of the flow battery system is specifically as follows:

i. determining whether the ratio of the power to the capacity of the flow battery system is larger than or equal to a first preset value, if so, executing Step ii, and if not, executing Step iii;

ii. with respect to a formula $SOC_{sum}=A \times SOC_a+B \times SOC_b$, configuring $0.1 \leq A \leq 0.3$ and $0.7 \leq B \leq 0.9$, and executing Step 2;

with respect to a formula $SOC_{sum}=A \times SOC_a+C \times SOC_c$, configuring $0.4 \leq A \leq 0.5$ and $0.5 \leq C \leq 0.6$, and executing Step 2;

with respect to a formula $SOC_{sum}=B \times SOC_b+C \times SOC_c$, configuring $0.7 \leq B \leq 0.9$ and $0.1 \leq C \leq 0.3$, and executing Step 2;

iii. determining whether the ratio of the power to the capacity of the flow battery system is smaller than or equal to a second preset value, if so, executing Step iv, and if not, executing Step v;

iv. with respect to a formula $SOC_{sum}=A \times SOC_a+B \times SOC_b$, configuring $0.4 \leq A \leq 0.5$ and $0.5 \leq B \leq 0.6$, and executing Step 2;

with respect to a formula $SOC_{sum}=A \times SOC_a+C \times SOC_c$, configuring $0.1 \leq A \leq 0.3$ and $0.7 \leq C \leq 0.9$, and executing Step 2;

with respect to a formula $SOC_{sum}=B \times SOC_b+C \times SOC_c$, configuring $0.1 \leq B \leq 0.3$ and $0.7 \leq C \leq 0.9$, and executing Step 2;

v. calculating a SOC mean $SOC_{mean}$ of any two pairs of monitoring positions via $SOC_{mean}=(SOC_a+SOC_b)/2$, $SOC_{mean}=(SOC_a+SOC_c)/2$ or $SOC_{mean}=(SOC_b+SOC_c)/2$, and executing Step vi;

vi. when $0<SOC_{mean} \leq 20\%$:

with respect to a formula $SOC_{sum}=A \times SOC_a+B \times SOC_b$, configuring $0.2 \leq A \leq 0.5$ and $0.5 \leq B \leq 0.8$, and executing Step 2;

with respect to a formula $SOC_{sum}=A \times SOC_a+C \times SOC_c$, configuring $0.4 \leq A \leq 0.5$ and $0.5 \leq C \leq 0.6$, and executing Step 2;

with respect to a formula $SOC_{sum}=B \times SOC_b+C \times SOC_c$, configuring $0.5 \leq B \leq 0.8$ and $0.2 \leq C \leq 0.5$, and executing Step 2;

when $20\%<SOC_{mean} \leq 80\%$, configuring $A=B=C$;

when $80\%<SOC_{mean}<100\%$:

with respect to a formula $SOC_{sum}=A \times SOC_a+B \times SOC_b$, configuring $0.4 \leq A \leq 0.5$ and $0.5 \leq B \leq 0.6$, and executing Step 2;

with respect to a formula $SOC_{sum}=A \times SOC_a+C \times SOC_c$, configuring $0.2 \leq A \leq 0.5$ and $0.5 \leq C \leq 0.8$, and executing Step 2;

with respect to a formula $SOC_{sum}=B \times SOC_b+C \times SOC_c$, configuring $0.2 \leq B \leq 0.5$ and $0.5 \leq C \leq 0.8$, and executing Step 2.

Figure 2:
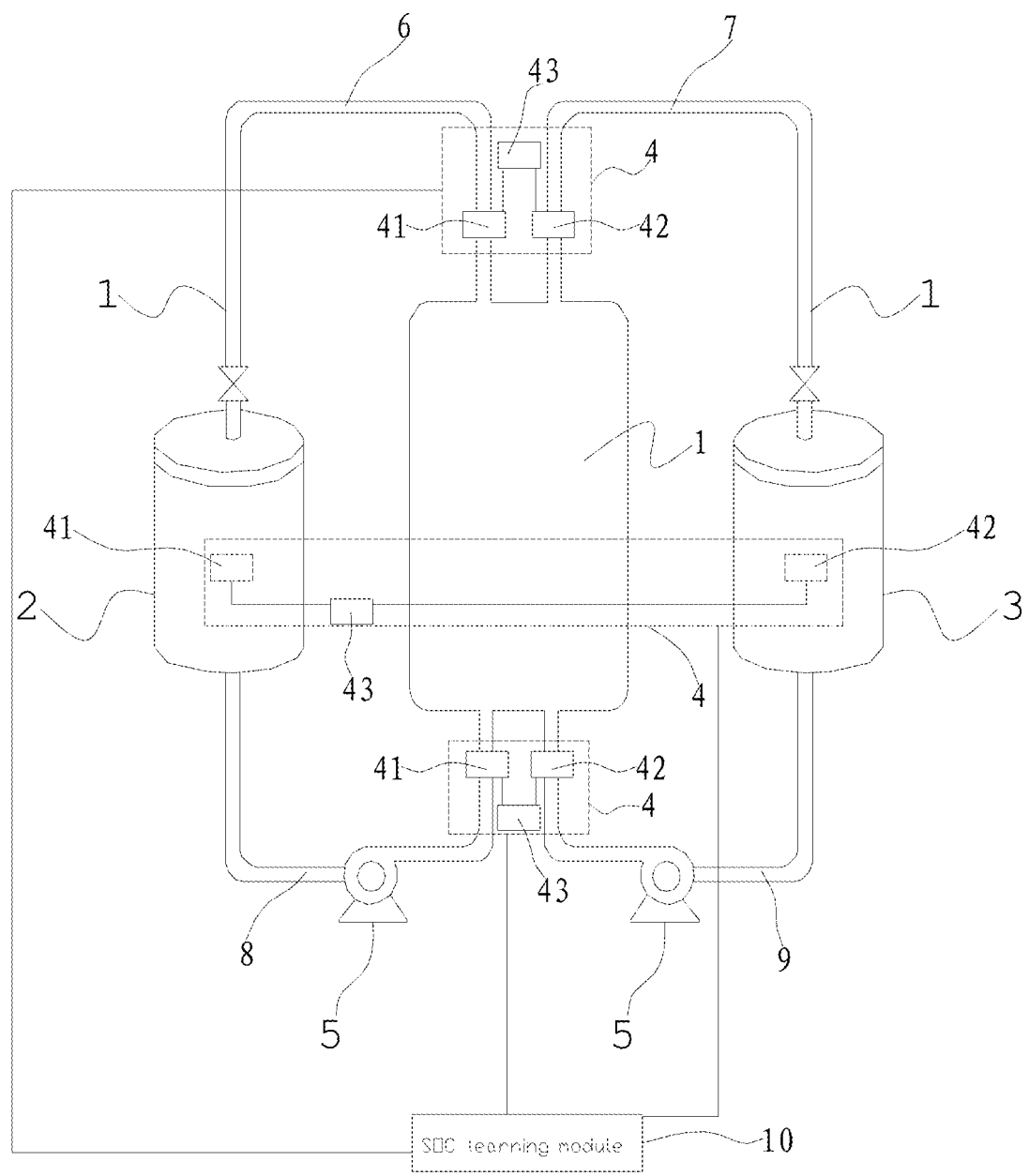
FIG. 2 is a structural schematic drawing representing a system for monitoring state of charge (SOC) of a flow battery system according to the second embodiment of the present invention.

FIG. 2 is a structural schematic drawing representing a system for monitoring state of charge (SOC) of a flow battery system according to the second embodiment of the present invention. As shown in FIG. 2, the flow battery system has a stack 1, an anode electrolyte storage tank 2, a cathode electrolyte storage tank 3 and an electrolyte circulating pipeline. The monitoring system includes a monitoring device configured to determine SOCs of at least two pairs of different monitoring positions. Each pair of monitoring positions is chosen from inside of the anode electrolyte storage tank 2 and inside of the cathode electrolyte storage tank 3, the anode electrolyte outlet pipeline of the stack 1 and the cathode electrolyte outlet pipeline of the stack 1, or the anode electrolyte inlet pipeline of the stack 1 and on the cathode electrolyte inlet pipeline of the stack 1. Preferably, the monitoring system further includes a connection monitoring device, and a SOC acquisition module 10 configured to acquire state of charge $SOC_{sum}$ of the flow battery system according to SOCs respectively corresponding to each pair of the monitoring positions. Preferably, when three pairs of monitoring positions are present, the SOC acquisition module 10 acquires state of charge $SOC_{sum}$ of the flow battery system using a formula $SOC_{sum}=A \times SOC_a+B \times SOC_b+C \times SOC_c$, wherein A, B and C are coefficients, and $A+B+C=1$; $SOC_a$ is SOC corresponding to the pair of monitoring positions: the inside of the anode electrolyte storage tank 2 and the inside of the cathode electrolyte storage tank 3; $SOC_b$ is SOC corresponding to the pair of monitoring positions: inside the anode electrolyte outlet pipeline of the stack 1 and inside the cathode electrolyte outlet pipeline of the stack 1; $SOC_c$ is SOC corresponding to the pair of monitoring positions: inside the anode electrolyte inlet pipeline of the stack 1 and inside the cathode electrolyte inlet pipeline of the stack 1. Preferably, when two pairs of monitoring positions are present, the SOC acquisition module 10 acquires $SOC_{sum}$ of the flow battery system using the formula $SOC_{sum}=A \times SOC_a+B \times SOC_b$ (this formula corresponds to two pairs of monitoring positions being respectively as follows: inside of the anode electrolyte storage tank 2 and inside of the cathode electrolyte storage tank 3, and inside the anode electrolyte outlet pipeline of the stack 1 and inside the cathode electrolyte outlet pipeline of the stack 1), the formula $SOC_{sum}=A \times SOC_a+C \times SOC_c$ (this formula corresponds to two pairs of monitoring positions being respectively as follows: inside of the anode electrolyte storage tank 2 and inside of the cathode electrolyte storage tank 3, or inside the anode electrolyte inlet pipeline of the stack 1 and inside the cathode electrolyte inlet pipeline of the stack 1), or formula $SOC_{sum}=B \times SOC_b+C \times SOC_c$ (this formula corresponds two pairs of monitoring positions being respectively as follows: inside the anode electrolyte outlet pipeline of the stack 1 and inside the cathode electrolyte outlet pipeline of the stack 1, and inside the anode electrolyte inlet pipeline of the stack 1 and inside the cathode electrolyte inlet pipeline of the stack 1), wherein, A, B and C are coefficients, and the sum of all the coefficients in each formula is equal to 1; $SOC_a$ is SOC corresponding to the pair of monitoring positions: inside of the anode electrolyte storage tank and inside of the cathode electrolyte storage tank; $SOC_b$ is SOC corresponding to the pair of monitoring positions: inside the anode electrolyte outlet pipeline of the stack and inside the cathode electrolyte outlet pipeline of the stack; $SOC_c$ is SOC corresponding to the pair of monitoring positions: inside the anode electrolyte inlet pipeline of the stack and inside the cathode electrolyte inlet pipeline of the stack. According to the present invention, coefficient A, B and C can be configured according to a ratio of a power to a capacity of the flow battery system, wherein a first preset value can be 5 in actual application, and a second preset value can be 0.2 in actual application. Monitoring positions inside an anode electrolyte storage tank 2 and inside a cathode electrolyte storage tank 3 are preferably in the center inside the anode electrolyte storage tank 2 and in the center of the cathode electrolyte storage tank 3, respectively.

In the second embodiment of the present invention, SOCs of at least two pairs of monitoring positions can be determined in a potentiometric titration manner, a spectrophotometric manner or a potential detection manner, and correspondingly, the monitoring device is a potentiometric titration device, a spectrophotometric device or a potential detection device, wherein the potentiometric titration manner and the spectrophotometric manner are used for determining SOCs in a manner of determining the contents of various valences of ions in anode electrolyte and cathode electrolyte according to available means, and the process of determining SOCs at different monitoring positions in a potential detection manner will be illustrated in detail as below:

The electrolyte circulating pipeline of the second embodiment of the present invention include an anode electrolyte outlet pipeline 6 of a stack, a cathode electrolyte outlet pipeline 7 of the stack, an anode electrolyte inlet pipeline 8 of the stack and a cathode electrolyte inlet pipeline 9 of the stack. The potential detection device 4 may specifically have a first potential monitoring module 41, a second potential monitoring module 42, and a potential difference acquisition module 43 connected with the first potential monitoring module 41 and the second potential monitoring module 42. A pair of monitoring devices are provided at monitoring positions: inside of the anode electrolyte storage tank and inside of the cathode electrolyte storage tank. The first potential monitoring module 41 and the second potential monitoring module 42 can be provided inside the anode electrolyte storage tank and the cathode electrolyte storage tank, respectively, and used for detecting the anode electrolyte potential inside the anode electrolyte storage tank and the cathode electrolyte potential inside the cathode electrolyte storage tank. The potential difference acquisition module 43 acquires a difference between the anode electrolyte potential and the cathode electrolyte potential. A pair of monitoring devices are provided at monitoring positions: inside the anode electrolyte outlet pipeline of the stack and inside the cathode electrolyte outlet pipeline of the stack. The first potential monitoring module 41 and the second electrolyte monitoring module 42 can be provided on the anode electrolyte outlet pipeline of the stack and on the cathode electrolyte outlet pipeline of the stack and used for detecting an anode electrolyte potential inside the anode electrolyte outlet pipeline of the stack and a cathode electrolyte potential inside the cathode electrolyte outlet pipeline of the stack. The potential difference acquisition module 43 acquires a difference between the anode electrolyte potential and the cathode electrolyte potential. A pair of monitoring devices are provided at the monitoring positions: inside the anode electrolyte inlet pipeline of the stack and inside the cathode electrolyte inlet pipeline of the stack. The first potential monitoring module 41 and the second potential monitoring module 42 can be provided on the anode electrolyte inlet pipeline of the stack and on the cathode electrolyte inlet pipeline of the stack, respectively, and used for detecting an anode electrolyte potential in the anode electrolyte inlet pipeline of the stack and an cathode electrolyte potential in the cathode electrolyte inlet pipeline of the stack, and further the potential difference acquisition module 43 acquires a difference between the anode electrolyte potential and the cathode electrolyte potential.

The potential detection device may be a potential monitor, a SOC battery or the like. After the potential detection device acquires the difference between the anode electrolyte potential and the cathode electrolyte potential at each pair of monitoring positions (determining the SOC under which the electrolyte suffers by detecting the difference between the anode electrolyte potential and the cathode electrolyte potential), state of charge $SOC_{sum}$ of the flow battery system can be acquired by using a weighted average method, and the $SOC_{sum}$ can also be obtained using other empirical formula. Each of the first potential monitoring module 41 and the second potential monitoring module 42 monitors a potential through electrodes placed inside the electrolyte, and specifically may be provided with a detection electrode, or may also comprise a detection electrode and a reference electrode (i.e., determining SOC under which the electrolyte suffers by detecting the difference between the anode electrolyte potential and the cathode electrolyte potential adopting a reference electrode method).

According to a method and system for monitoring state of charge (SOC) of a flow battery system provided by the first embodiment and the second embodiment of the present invention, state of charge (SOC) of the flow battery system is further determined by integrating SOCs at a plurality of monitoring positions of the flow battery, such that a monitoring result of the state of charge (SOC) is closer to a real numerical value, and has the characteristics of accuracy and comprehensiveness in monitoring and convenience in real-time learning of state of charge (SOC) of the flow battery system at different monitoring positions and realizes the redundancy of SOC measurement. In addition, monitoring devices provided at some monitoring positions can still ensure real-time acquisition of a SOC monitoring result in case of having a fault, thereby being conductive to improving the service efficiency of the flow battery, prolonging the service life of the battery and accurately managing the flow battery system.

Table 1 provides monitoring error comparison data of the flow battery system, which are acquired by adopting different SOC monitoring methods, wherein monitoring error data respectively corresponds to: in a first case: SOC at a stack inlet is taken as $SOC_{sum}$ of the flow battery system; in a second case: SOC at the stack outlet is taken as $SOC_{sum}$ of the flow battery system; in a third case: SOCs inside the anode electrolyte storage tank and inside the cathode electrolyte storage tank is taken as $SOC_{sum}$ of the flow battery system; and in a fourth case: SOCs at three pairs of monitoring positions: an inside of the anode electrolyte storage tank and an inside of the cathode electrolyte storage tank, inside the anode electrolyte outlet pipeline of the stack and inside the cathode electrolyte outlet pipeline of the stack, or inside the anode electrolyte inlet pipeline of the stack and inside the cathode electrolyte inlet pipeline of the stack are taken as $SOC_{sum}$, and as can be seen from Table 1, the SOC monitoring result of the present invention has a smaller error and is very accurate.

TABLE 1

Monitoring Error Comparison Data Under Different SOC Monitoring Methods

| Operating conditions of the flow battery system | the first case | the second case | the third case | the fourth case |
|---|---|---|---|---|
| $SOC_{average}$ = 90% | =5.24% | =3.65% | =2.78% | =0.74% |
| $SOC_{average}$ = 15% | =4.77% | =3.21% | =2.65% | =0.58% |
| power/capacity = 0.2 | =6.19% | =7.38% | =2.55% | =0.83% |
| power/capacity = 5 | =7.83% | =8.28% | =4.32% | =1.07% |

Figure 3:
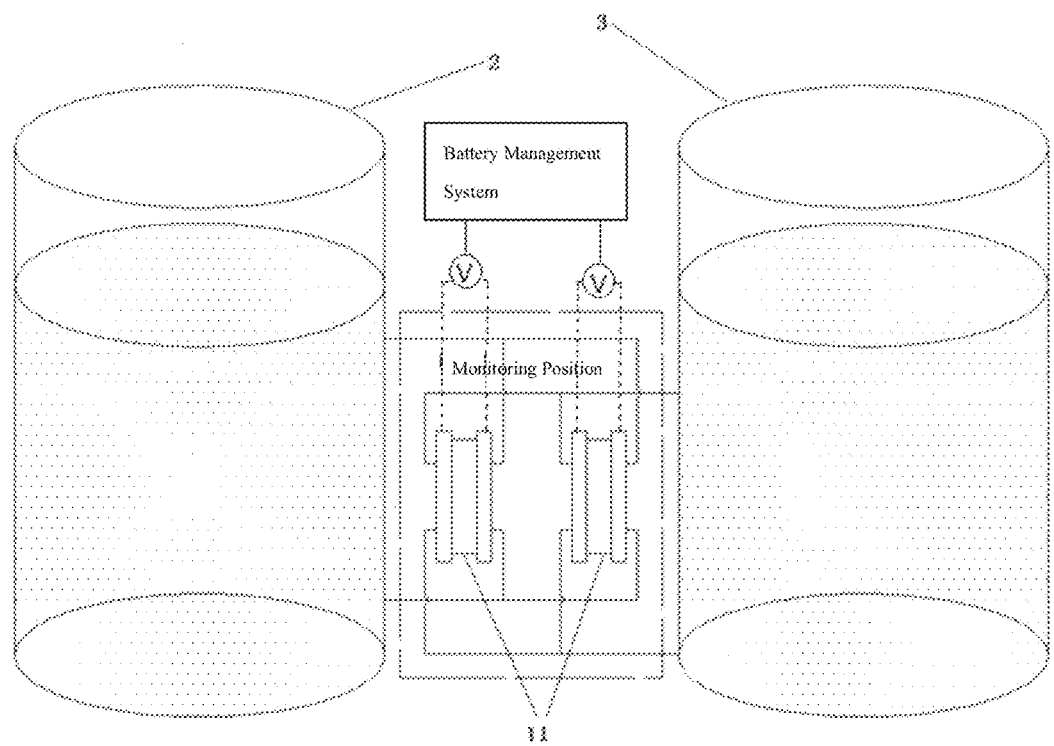
FIG. 3 is a structural schematic drawing representing a flow battery based on a redundancy design of SOC detection devices according to the third embodiment of the present invention.

FIG. 3 is a structural schematic drawing representing a flow battery based on a redundancy design of SOC detection devices according to the third embodiment of the present invention. As shown in FIG. 3, the accuracy of measured SOC values is ensured by a redundancy design, i.e., at least two pairs of SOC detection devices 11 are provided at the same monitoring position. The monitoring positions may be any pair of positions chosen from inside of the anode electrolyte storage tank 2 and an inside of the cathode electrolyte storage tank 3, or on the electrolyte inlet pipeline of the stack and on the electrolyte outlet pipeline of the stack. I.E., an anode of each SOC detection device 11 can be arranged inside the anode electrolyte storage tank 2, and a cathode of the SOC detection device 11 can be arranged inside the cathode electrolyte storage tank 3; or, the anode of the SOC detection device 11 is connected with the anode electrolyte inlet pipeline of the stack, and the cathode of the SOC detection device is connected with the cathode electrolyte inlet pipeline of the stack; or, the anode of the SOC detection device 11 is connected with the anode electrolyte outlet pipeline of the stack, and the cathode of the SOC detection device 11 is connected with the cathode electrolyte outlet pipeline of the stack.

Figure 4:
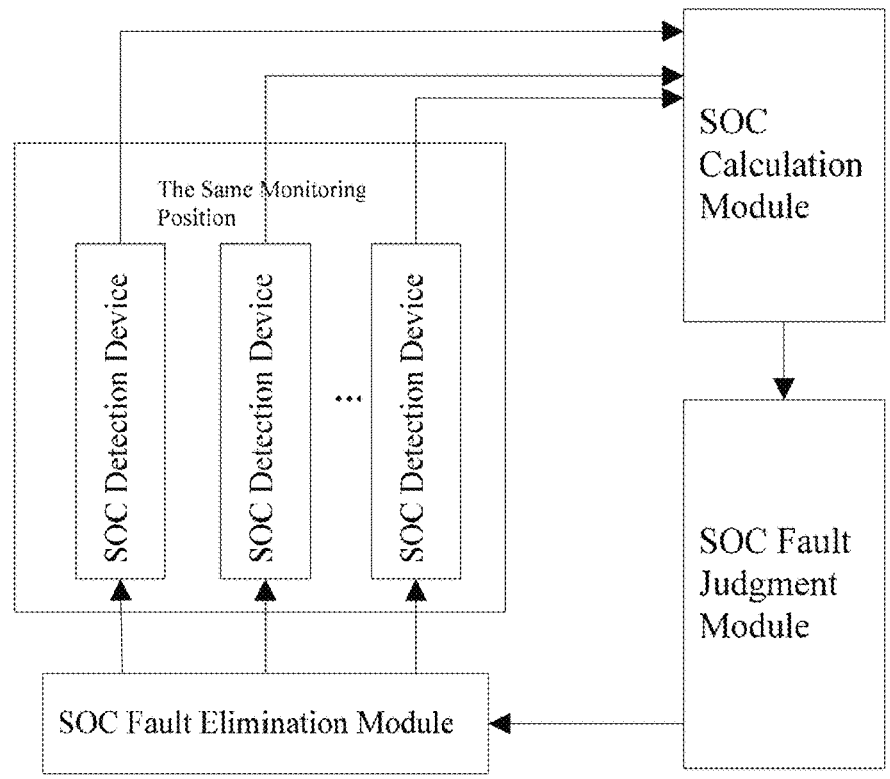
FIG. 4 is a structural schematic drawing representing a battery management system of the flow battery based on a redundancy design of SOC detection devices according to the third embodiment of the present invention.

FIG. 4 is a structural schematic drawing representing a battery management system of the flow battery based on a redundancy design of SOC detection devices according to the third embodiment of the present invention. As shown in FIG. 4, the battery management system includes a SOC calculation module, a SOC fault judgment module and a SOC fault elimination module, wherein the SOC calculation module is configured to obtain a SOC value corresponding to each SOC detection device according to a signal detected by the SOC detection device which is in an operating state. The SOC fault judgment module is configured to compare the calculated SOC values, and determine the SOC detection device which is in a faulty state; the SOC fault judgment module can determine the SOC detection device which is in a faulty state through a predetermined fault judgment program.

Figure 6:
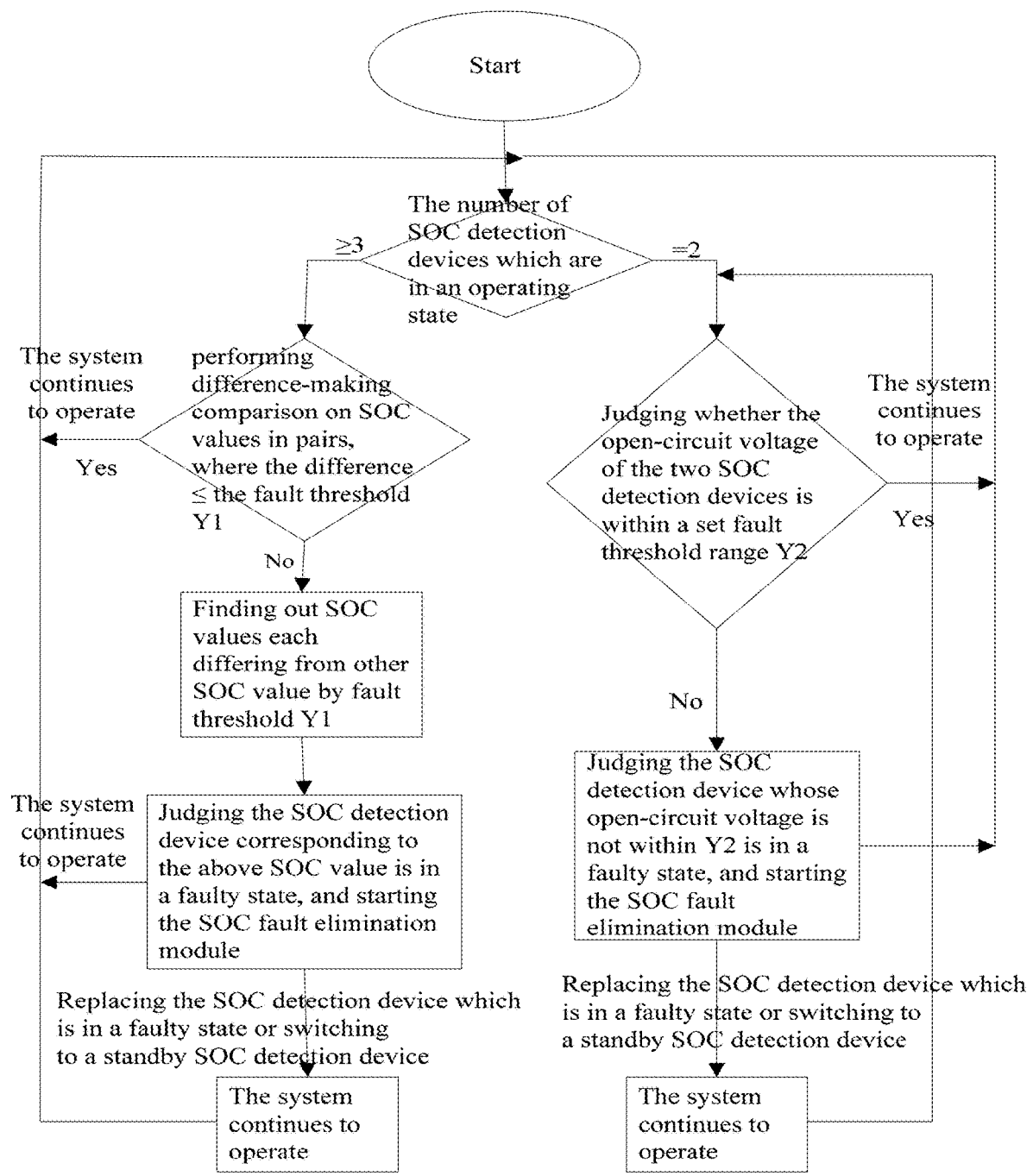
FIG. 6 is a flowchart representing a fault judgment program of the flow battery based on a redundancy design of SOC detection devices according to the third embodiment of the present invention.

FIG. 6 is a flowchart representing the fault judgment program of the flow battery based on a redundancy design of SOC detection devices according to the third embodiment of the present invention. As shown in FIG. 6, the fault judgment program covers two scenarios according to the number of pairs of the SOC detection devices that are in an operating state, including: (1) when more than two pairs of SOC detection devices are in an operating state, a working mode of the SOC fault judgment module is as follows:

performing difference-making comparison between each SOC value obtained by calculation and other SOC value corresponding to the SOC detection device, if a difference between the current SOC value and other SOC value is larger than a set fault threshold $Y^1$ (e.g., 5%), then determining that the current SOC detection device is in a faulty state, and initiating the SOC fault elimination module;

(2) when two pairs of SOC detection devices are in an operating state, a working mode of the SOC fault judgment module is as follows:

determining whether an open-circuit voltage of the two pairs of SOC detection devices is within a set fault threshold range $Y^2$. If the open-circuit voltage of the current SOC detection device is not within the fault threshold range $Y^2$, then determining that the current SOC detection device is in a faulty state, and initiating the SOC fault elimination module.

The fault threshold range $Y^2$ refers to an open-circuit voltage value of a corresponding number of batteries in the stack when the flow battery system is in a standby state. If the current open-circuit voltage of single battery in the stack is 1.55V, the threshold range of the $Y^2$ value generally is 1.53V to 1.57V. The fault threshold range $Y^2$ can be specifically set according to the actual number of SOC detection devices and number of batteries in the stack, as well as a connecting structure. For example, it is set that one pair of SOC detection devices (inside which one SOC battery is provided) is connected in parallel to the electrolyte inlet pipeline of one stack, then the open-circuit voltage value of a corresponding number of batteries in the stack is equal to the total voltage of the stack/the number of batteries. If it is set that n pairs of SOC detection devices (inside which m SOC batteries are provided) are connected in parallel to the electrolyte inlet pipeline of one stack, then the open-circuit voltage value of a corresponding number of batteries in the stack is equal to m*the total voltage of the stack/the number of batteries. In another example, it is set that a pair of SOC detection devices are connected in parallel to the electrolyte outlet pipeline of three stacks connected in series, then the open-circuit voltage value of a corresponding number of batteries in the stacks is equal to the total voltage of three stacks/the number of batteries in the three stack.

After the SOC fault elimination model is initiated, the SOC calculation module recalculates SOCs, and the SOC fault judgment module continues to compare the calculated SOC values, and redetermine the SOC detection devices which are in a faulty state. Preferably, the flow battery can adopts the simplest one-in-use and one-standby design structure in the redundancy design structure of the flow battery at the same monitoring position. It may also adopt a multi-use and multi-standby design structure. I.e., at least N pairs of mutually redundant SOC detection devices are provided, wherein N−M pairs of SOC detection devices are in an operating state, and M pairs of SOC detection devices are in a standby state, where 2≤N−M<N, and N≥3.

Meanwhile, in order to deal with the situation that the SOC detection devices which are in a faulty state cannot be replaced in time for the flow battery, but it is still necessary to ensure the measurement accuracy of SOC values or it is necessary to switch the SOC detection device from a standby state to an operating state, etc. Based on the redundancy design structure of the SOC detection devices, the battery management system is also provided with a state switching module, in addition to the SOC calculation module, the SOC fault judgment module and the SOC fault elimination module, wherein the state switching module is configured to control switching of the standby SOC detection device between the standby state and the operating state. For example, after the SOC fault elimination module executes a closing operation of two valves at two ends of the faulty SOC detection device, automatically control the valves at two ends of the standby SOC detection device to be opened, and switch the SOC detection devices from a standby state to an operating state. Or, after a fault is removed from the faulty SOC detection device, the state switching module switches the SOC detection device to an operating state again, and controls the valves at two ends of the standby SOC detection device to be closed, and switches the standby SOC detection device from an operating state to a standby state. After the battery system finishes a switching operation, the SOC calculation module performs recalculation, and meanwhile, the SOC fault judgment module continues to compare the calculated SOC values and redetermines the SOC detection device which is in a faulty state so as to ensure the continuity and effectiveness of SOC value measurement.

Figure 7:
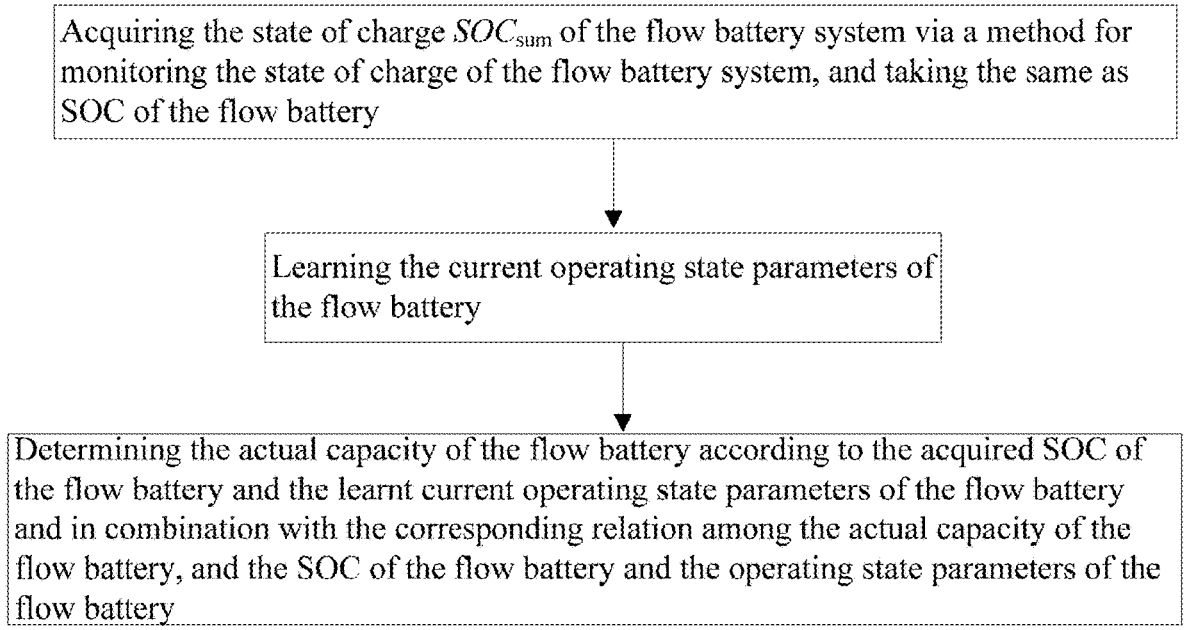
FIG. 7 is a flowchart representing a method for determining an actual capacity of a flow battery according to the fourth embodiment of the present invention.

The SOC detection device of the third embodiment of the present invention comprises, but is not limited to, SOC batteries and a potentiometer; FIGS. 5-a, 5-b and 5-c are schematic sketches of redundant structures of different SOC detection devices according to the first embodiment of the present invention, and the flow battery based on a redundancy design of the SOC detection devices will be further illustrated as below in combination with FIGS. 5-a, 5-b and 5-c: As shown in FIG. 5-a, C1 to C4 are a group of SOC detection devices, with the monitoring positions being inlet pipelines of the stack (in FIG. 5-a, R+: an anode inlet pipeline of the stack; and R−: a cathode inlet pipeline of the stack). Valves controlled by the state switching module are mounted at the front end and the rear end of each of C1 to C4, and a fluid path relationship of C1 to C4 is parallel connection. The current state, i.e., C1 to C3 are in an operating state, is set, the valves of C4 are closed (i.e., a standby state), and a corresponding average value is calculated according to the SOC values detected by C1 to C3 and is taken as a SOC value of the flow battery; if it is found at certain moment $t_1$ that the difference between the SOC numerical value obtained based on a value detected by C1 and each of the SOC numerical values obtained based on values detected by C2 and C3 is larger than 5%, and it is judged that C1 is faulty according to a predetermined fault judgment program as shown in FIG. 7. The valves at the front end and the rear end of C1 can be closed at the moment and then C1 which is in a faulty state is halted and replaced, or the valves of C4 which is in a standby state are opened and SOC calculation is performed again, then the calculated SOC values are continued to be compared, and the SOC detection device which is in a faulty state is redetermined to ensure the continuity and effectiveness of SOC value measurement. If the current battery system does not allow replacement of C1, the SOC calculation is directly adjusted to calculate a SOC average value detected by C2 and C3, and the flow battery system continues to operate. If the current battery system allows replacement of C1, then after C1 is replaced, it is possible to switch C1 which is in a standby state to an operating state, and the calculation of SOC can be adjusted to calculate a SOC average value detected by C1 to C3. If the valves at the front end and the rear end of C4 are opened, i.e., C4 which is in a standby state is switched to an operating state, the SOC calculation at this moment can be adjusted to calculate a SOC average value detected by C2 to C4.

As shown in FIG. 5-b, C1 to C3 are a group of SOC detection devices, the monitoring positions thereof being outlet pipelines of the stack (in FIG. 5-b, L+: an anode outlet pipeline of the stack; L−: a cathode outlet pipeline of the stack). Valves are mounted at the front end and the rear end of each of C1 to C3, and a fluid path relationship of C1 to C3 is serial connection. A corresponding average value is calculated according to the SOC values detected by C1 to C3 and is taken as a SOC value of the flow battery. If it is found at certain moment $t_2$ that the difference between the SOC numerical value obtained based on a value detected by C2 and each of the SOC numerical values obtained based on values detected by C1 and C3 is larger than 5%, and it is judged that C2 has a fault according to a predetermined fault judgment program as shown in FIG. 7. The valves at the front end and the rear end of C2 can be closed at this moment, and the SOC calculation at this moment can be adjusted to calculate a SOC average value detected by C1 and C3, and the flow battery system continues to operate. Meanwhile, C2 is replaced if the system permits. After C2 is replaced, it is possible to switch C2 which is in a standby state to an operating state, and the SOC calculation can be adjusted to calculate a SOC average value detected by C1 to C3.

As shown in FIG. 5-c, C1 and C2 are a group of SOC batteries, the monitoring positions thereof being at electrolyte storage tank sides. Electrolyte flows to the SOC batteries by using a liquid level height difference; wherein, a fluid path relationship of C1 and C2 is parallel connection, and current C1 and C2 are in an operating state. A corresponding average value is calculated according to the SOC values detected by C1 to C2 and is taken as a SOC value of the flow battery. If it is found at certain moment $t_3$ that there is a difference between the values detected by C1 and C2 and the difference is larger than 5%, and it is judged that C2 is faulty and C1 is normal according to a predetermined fault judgment program as shown in FIG. 7. The valves at the front end and the rear end of C2 can be closed at this moment, and SOC calculation at this moment can be adjusted to calculate SOC according to a numerical value detected by C1, and the flow battery system continues to operate. Meanwhile, C2 is replaced if the system permits; then after C2 is replaced, the valves at the front end and the rear end of C2 are opened (C1 is switched from a standby state to an operating state) and the calculation of SOC at this moment can be adjusted to calculate a SOC average value detected by C1 to C2.

FIG. 7 is a flowchart representing a method for determining an actual capacity of a flow battery according to the fourth embodiment of the present invention. As shown in FIG. 7, a method for determining an actual capacity of a flow battery includes the following steps:

Step 1: acquiring state of charge $SOC_{sum}$ of the flow battery system by means of the method for monitoring state of charge (SOC) of the flow battery system according to any one of claims, and taking $SOC_{sum}$ as SOC of the flow battery;

Step 2: learning current operating state parameters of the flow battery;

Step 3: determining the actual capacity of the flow battery according to the acquired SOC of the flow battery, the current operating state parameters of the flow battery, in combination with the corresponding relationship among the actual capacity of the flow capacity, and SOC of the flow battery and the operating state parameters of the flow battery.

Further, the actual capacity of the flow battery specifically includes an actual dischargeable capacity of the flow battery. The operating state parameters of the flow battery at least include: a ratio of a discharge power to a rated power, electrolyte temperature, electrolyte flow rate, the corresponding relationship among the actual dischargeable capacity of the flow battery, SOC of the flow battery, and the operating parameters of the flow battery is $C_d = C_r \times R_{(SOC,P)} \times R_{(T,P)} \times R_{(F,P)}$. $C_d$ is the actual dischargeable capacity of the flow battery. $C_r$ the rated discharge capacity of the flow battery. $R_{(SOC,P)}$ is a ratio of the actual dischargeable capacity of the flow battery to the rated discharge capacity of the flow battery under the conditions of different SOCs of the flow battery and different ratios of the discharge power of the flow battery to the rated power of the flow battery. $R_{(T,P)}$ is a ratio of the actual dischargeable capacity of the flow battery to the rated discharge capacity of the flow battery under the conditions of different electrolyte temperatures and different ratios of the discharge power of the flow battery and the rated power of the flow battery; $R_{(F,P)}$ is a ratio of the actual dischargeable capacity of the flow battery to the rated discharge capacity of the flow battery under the conditions of different electrolyte flows and different ratios of the discharge power of the flow battery to the rated power of the flow battery.

Further, the actual capacity of the flow battery further includes an actual chargeable capacity of the flow battery. The operating state parameters of the flow battery further include: a ratio of a charge power to a rated power. The corresponding relationship among the actual chargeable capacity of the flow battery, and SOC of the flow battery and the operating state parameters of the flow battery is $C_c = C'_r \times R'_{(SOC,P)} \times R'_{(T,P)} \times R'_{(F,P)}$, wherein $C_c$ is the actual chargeable capacity of the flow battery. $C'_r$ is the rated charge capacity of the flow battery. $R'_{(SOC,P)}$ is a ratio of the actual chargeable capacity of the flow battery to the rated charge capacity of the flow battery under the conditions of different SOCs of the flow battery and different ratios of the charge power of the flow battery to the rated power of the flow battery. $R'_{(T,P)}$ is a ratio of the actual chargeable capacity of the flow battery to the rated charge capacity of the flow battery under the conditions of different electrolyte temperatures and different ratios of the charge power of the flow battery to the rated power of the flow battery. $R'_{(F,P)}$ is a ratio of the actual chargeable capacity of the flow battery to the rated charge capacity of the flow battery under the conditions of different electrolyte flows and different ratios of the charge power of the flow battery to the rated power of the flow battery. Further, the operating state parameters of the flow battery further include at least one of an operating mode of the flowing battery, ambient temperature, electrolyte pressure, liquid level difference of electrolyte in the anode electrolyte storage tank and the cathode electrolyte storage tank, and electrolyte concentration.

Further, the method comprises: pre-storing ratios of the actual dischargeable capacity to the rated discharge capacity of the flow battery operating under the conditions of different SOCs and different ratios of the discharge power to the rated power in advance; pre-storing ratios of the actual dischargeable capacity to the rated discharge capacity of the flow battery operating under the conditions of different electrolyte temperatures and different ratios of the discharge power and the rated power in advance; pre-storing ratios of the actual dischargeable capacity to the rated discharge capacity of the flow battery operating under the conditions of different electrolyte flows and different ratios of the discharge power to the rated power in advance; pre-storing ratios of the actual chargeable capacity to the rated charge capacity of the flow battery operating under the conditions of different SOCs and different ratios of the charge power to the rated power in advance; pre-storing ratios of the actual chargeable capacity to the rated charge capacity of the flow battery operating under the conditions of different electrolyte temperatures and different ratios of the charge power to the rated power in advance; pre-storing ratios of the actual chargeable capacity to the rated charge capacity of the flow battery operating under the conditions of different electrolyte flows and different ratios of the charge power to the rated power in advance.

Further, the Step 3 is specifically as follows: determining corresponding parameters $R_{(SOC,P)}$, $R_{(T,P)}$ and $R_{(F,P)}$ according to the acquired SOC of the flow battery, the ratio of the current discharge power to the rated power of the flow battery, the electrolyte temperature and the electrolyte flow, and further obtaining the actual dischargeable capacity $C_d$ of the flow battery in combination with $C_d = C_r \times R_{(SOC,P)} \times R_{(T,P)} \times R_{(F,P)}$; determining corresponding parameters $R'_{(SOC,P)}$, $R'_{(T,P)}$ and $R'_{(F,P)}$ according to the acquired SOC of the flow battery, and the ratio of the current charge power to the rated power of the flow battery, the electrolyte temperature and the electrolyte flow, and further obtaining the actual chargeable capacity $C_c$ of the flow battery in combination with $C_d = C'_r \times R'_{(SOC,P)} \times R'_{(T,P)} \times R'_{(F,P)}$.

Figure 8:
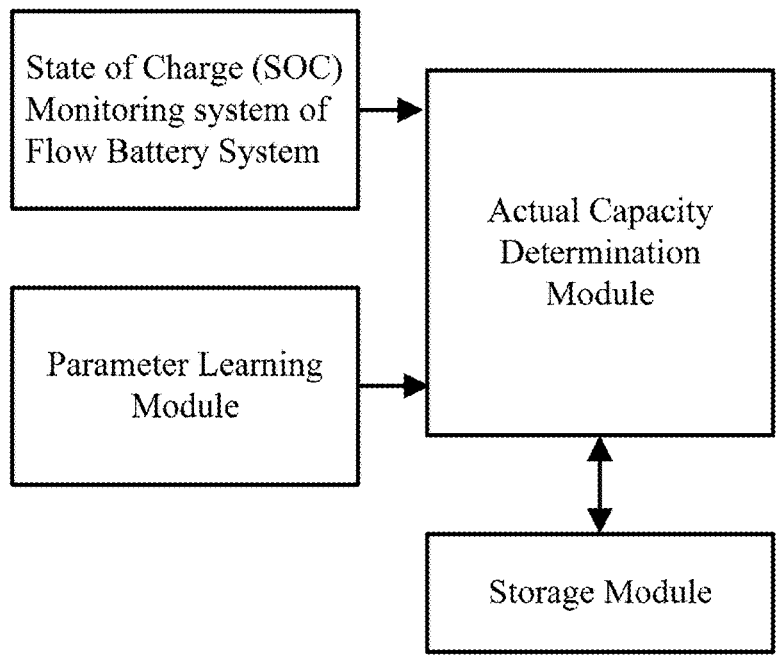
FIG. 8 is a block diagram representing a device for determining an actual capacity of a flow battery according to the fifth embodiment of the present invention.

FIG. 8 is a structural block diagram representing a device for determining an actual capacity of a flow battery according to the fifth embodiment of the present invention. As shown in FIG. 8, a device for determining an actual capacity of a flow battery includes the state of charge (SOC) state monitoring system of the flow battery system; a parameter learning module configured to learn current operating state parameters of the flow battery; an actual capacity determination module which is connected with the state of charge (SOC) monitoring system and the parameter learning module of the flow battery system. The state of charge $SOC_{sum}$ of the flow battery system acquired by the SOC acquisition module included in the SOC state monitoring system of the flow battery system serves as SOC of the flow battery. The actual capacity determination module is configured to determine the actual capacity of the flow battery according to the acquired SOC of the flow battery, the current operating state parameters of the flow battery, in combination with the corresponding relationship among the actual capacity of the flow battery, and SOC of the flow battery and the operating state parameters of the flow battery. Further, the actual capacity of the flow battery specifically includes an actual dischargeable capacity of the flow battery.

The operating state parameters of the flow battery at least include: a ratio of a discharge power to a rated power, electrolyte temperature and electrolyte flow, the corresponding relationship among the actual dischargeable capacity of the flow battery, and SOC of the flow battery and the operating state parameters of the flow battery is $C_d = C_r \times R_{(SOC,P)} \times R_{(T,P)} \times R_{(F,P)}$, wherein $C_d$ is the actual dischargeable capacity of the flow battery. $C_r$ is the rated discharge capacity of the flow battery. $R_{(SOC,P)}$ is a ratio of the actual dischargeable capacity of the flow battery to the rated discharge capacity of the flow battery under the conditions of different SOCs of the flow battery and different ratios of the discharge power of the flow battery to the rated power of the flow battery. $R_{(T,P)}$ is a ratio of the actual dischargeable capacity of the flow battery to the rated discharge capacity of the flow battery under the conditions of different electrolyte temperatures and different ratios of the discharge power of the flow battery to the rated power of the flow battery. $R_{(F,P)}$ is a ratio of the actual dischargeable capacity of the flow battery to the rated discharge capacity of the flow battery under the conditions of different electrolyte flows and different ratios of the discharge power of the flow battery to the rated power of the flow battery. Further, the actual capacity of the flow battery further includes an actual chargeable capacity of the flow battery.

The operating parameters of the flow battery at least include: a ratio of a charge power to a rated power; the corresponding relationship among the actual chargeable capacity of the flow battery, and SOC of the flow battery and the operating state parameters of the flow battery is $C_d=C'_r \times R'_{(SOC,P)} \times R'_{(T,P)} \times R'_{(F,P)}$. $C_c$ is the actual chargeable capacity of the flow battery. $C'_r$ is the rated charge capacity of the flow battery. $R'_{(SOC,P)}$ is a ratio of the actual chargeable capacity of the flow battery to the rated charge capacity of the flow battery under the conditions of different SOCs of the flow battery and different ratios of the charge power of the flow battery to the rated power of the flow battery. $R'_{(T,P)}$ is a ratio of the actual chargeable capacity of the flow battery to the rated charge capacity of the flow battery under the conditions of different electrolyte temperatures and different ratios of the charge power of the flow battery to the rated power of the flow battery. $R'_{(F,P)}$ is a ratio of the actual chargeable capacity of the flow battery to the rated charge capacity of the flow battery under the conditions of different electrolyte flows and different ratios of the charge power of the flow battery to the rated power of the flow battery. Further, the operating state parameters of the flow battery further include at least one of an operating mode of the flowing battery, ambient temperature, electrolyte pressure, liquid level difference of electrolyte in the anode electrolyte storage tank and the cathode electrolyte storage tank, and electrolyte concentration.

Further, the determination device further comprises a storage module connected with the actual capacity determination module. The storage module is configured to pre-store ratios of the actual dischargeable capacity to the rated discharge capacity of the flow battery operating under the conditions of different SOCs and different ratios of the discharge power to the rated power in advance, to pre-store ratios of the actual dischargeable capacity to the specified discharge capacity of the flow battery operating under the conditions of different electrolyte temperatures and different ratios of the discharge power to the rated power in advance, to pre-store ratios of the actual dischargeable capacity to the specified discharge capacity of the flow battery operating under the conditions of different electrolyte flows and different ratios of the discharge power to the specified power in advance, to pre-store ratios of the actual chargeable capacity to the specified charge capacity of the flow battery operating under the conditions of different SOCs and different ratios of the charge power to the specified power in advance, to pre-store ratios of the actual chargeable capacity to the specified charge capacity of the flow battery operating under the conditions of different electrolyte temperatures and different ratios of the charge power to the specified power in advance, and to pre-store ratios of the actual chargeable capacity to the specified charge capacity of the flow battery operating under the conditions of different electrolyte flows and different ratios of the charge power to the specified power in advance.

Further, the actual capacity determination module is configured to determine corresponding parameters $R_{(SOC,P)}$, $R_{(T,P)}$ and $R_{(F,P)}$ according to the acquired SOC of the flow battery, the ratio of the current discharge power to the specified power of the flow battery, the electrolyte temperature and the electrolyte flow, and further obtain the actual dischargeable capacity $C_d$ of the flow battery in combination with $C_d=C_r \times R_{(SOC,P)} \times R_{(T,P)} \times R_{(F,P)}$. The method includes obtaining, by a SOC monitoring system of the flow battery system, a current SOC state of the flow battery; obtaining, by a parameter learning module, a current discharge power of the flow battery; and further obtaining a ratio of the discharge power to the rated power of the flow battery; then obtaining, by the actual capacity determination module, $R_{(SOC,P)}$ corresponding to the current SOC state of the flow battery and the ratio of the current discharge power to the rated power of the flow battery according to the current SOC state of the flow battery and the ratio of the current discharge power to the rated power of the flow battery and in combination with different pre-stored SOCs, and the ratios $R_{(SOC,P)}$ of the current dischargeable capacity to the rated discharge capacity, which correspond to pre-stored different ratios of the discharge power to the rated power, and similarly obtaining, by the parameter learning module, the current electrolyte temperature of the flow battery; then obtaining, by the actual capacity determination module, $R_{(T,P)}$ corresponding to the current electrolyte temperature of the flow battery and a ratio of the current discharge power to the rated power of the flow battery according to the current electrolyte temperature of the flow battery and the ratio of the current discharge power and the rated power of the flow battery and in combination with pre-stored different electrolyte temperatures and ratios $R_{(T,P)}$ of the actual dischargeable capacity to the rated discharge capacity, which correspond to pre-stored different ratios of the discharge power to the rated power, and similarly obtaining, by the parameter learning module, the current electrolyte flow of the flow battery; then obtaining, by the actual capacity determination module, $R_{(F,P)}$ corresponding to the current electrolyte flow of the flow battery and a ratio of the current discharge power to the rated power of the flow battery according to the current electrolyte flow of the flow battery and the ratio of the current discharge power to the rated power of the flow battery and in combination with pre-stored different electrolyte flows and ratios $R_{(F,P)}$ of the actual dischargeable capacity to the rated discharge capacity, which correspond to pre-stored different ratios of the discharge power to the rated power, and further obtaining, by the actual capacity determination module, an actual dischargeable capacity $C_d$ of the flow battery according to $C_d=C_r \times R_{(SOC,P)} \times R_{(T,P)} \times R_{(F,P)}$, wherein $C_r$ is a rated discharge capacity of the flow battery, is generally entitled by a manufacturer and is specifically a capacity at least dischargeable by the flow battery under standard conditions: e.g., SOC is 100%, the electrolyte temperature is 40° C., and the electrolyte flow is the capacity obtained by discharging the flow battery at a rated power under the condition of the maximum flow; determining, by the actual capacity determination module, corresponding parameters $R'_{(SOC,P)}$, $R'_{(T,P)}$ and $R'_{(F,P)}$ according to the acquired SOC of the flow battery, a ratio of the current charge power to the rated power of the flow battery, the electrolyte temperature and the electrolyte flow, and further obtaining an actual chargeable capacity $C_c$ of the flow battery in combination with $C_d=C'_r \times R'_{(SOC,P)} \times R'_{(T,P)} \times R'_{(F,P)}$, to be specific, obtaining, by the state of charge (SOC) monitoring system of the flow battery system, a current SOC state of the flow battery, obtaining, by the parameter learning module, a current charge power of the flow battery, and further obtaining a ratio of the charge power to the rated power of the flow battery; then obtaining, by the actual capacity determination module, $R'_{(SOC,P)}$ corresponding to the current SOC state of the flow battery and a ratio of the current charge power to the rated power of the flow battery according to the current SOC state of the flow battery and the ratio of the current charge power to the rated power of the flow battery and in combination with pre-stored different SOCs and ratios $R'_{(SOC,P)}$ of the actual chargeable capacity to the rated charge power, which correspond to pre-stored different ratios of the charge power to the rated power, and similarly obtaining, by the parameter learning module, the current electrolyte temperature of the flow battery; then obtaining, by the actual capacity determination module, $R'_{(T,P)}$ corresponding to the current electrolyte temperature of the flow battery and a ratio of the current charge power to the rated power of the flow battery according to the current electrolyte temperature of the flow battery and the ratio of the current charge power to the rated power of the flow battery and in combination with pre-stored different electrolyte temperatures and ratios $R'_{(T,P)}$ of the actual chargeable capacity to the rated charge capacity, which correspond to pre-stored different ratios of the charge power to the rated power, and similarly obtaining, by the parameter learning module, the current electrolyte flow of the flow battery; then obtaining, by the actual capacity determination module, $R'_{(F,P)}$ corresponding to the current electrolyte flow of the flow battery and a ratio of the current charge power to the rated power of the flow battery according to the current electrolyte flow of the flow battery and the ratio of the current charge power to the rated power of the flow battery and in combination with pre-stored different electrolyte flows and ratios $R'_{(F,P)}$ of the actual chargeable capacity to the rated charge capacity, which correspond to pre-stored different ratios of the charge power to the rated power; further obtaining, by the actual capacity determination module, an actual chargeable capacity $C_c$ of the flow battery according to $C_d = C'_r \times R'_{(SOC,P)} \times R'_{(T,P)} \times R'_{(F,P)}$ of the flow battery, wherein $C'_r$ is a rated charge capacity of the flow battery, is generally entitled by a manufacturer and is specifically the maximum capacity allowable by the flow battery under standard conditions: e.g., SOC is 100%, the electrolyte temperature is 40° C., and the electrolyte flow is the capacity obtained by charging the flow battery at a rated power under the condition of maximum flow.

According to the fourth embodiment and the fifth embodiment of the present invention, each pre-stored ratio $R_{(SOC,P)}$ of the actual dischargeable capacity to the rated discharge capacity of the flow battery operating under the conditions of different SOCs and different ratios of the discharge power to the rated power is acquired according to the following process: discharging the flow battery at different constant powers under different SOCs, where different SOCs may be in a range of 0% to 100%, the discharging operation of the flow battery can be performed at every certain SOC interval (e.g., 1% to 5%), or can be performed under each SOC in the range of 0% to 100%; further obtaining a plurality of corresponding actual dischargeable capacity values $C_d$ (i.e., the actual capacity $C_d$ discharged by the flow battery is obtained under any SOC within a range of 0% to 100% and discharge power ranging from 0 to Pr) of the flow battery respectively operating under each SOC state and under each discharge power by adopting different discharge powers, (e.g., 0.1Pr, 0.2Pr . . . Pr), wherein Pr is the rated power of the flow battery, and the corresponding different discharge powers 0.1Pr, 0.2Pr . . . Pr correspond to different ratios 0.1, 0.2 . . . 1 of the discharge power to the rated power, i.e., obtaining a corresponding relationship among the actual dischargeable capacity, SOC, and the ratio of the discharge power to the rated power; further obtaining $R_{(SOC,P)}$ (a ratio of the actual discharge capacity $C_d$ of the flow battery to the rated discharge capacity $C_r$ of the flow battery) under any SOC within a range of 0% to 100% and discharge power ranging from 0 to Pr.

Figure 9:
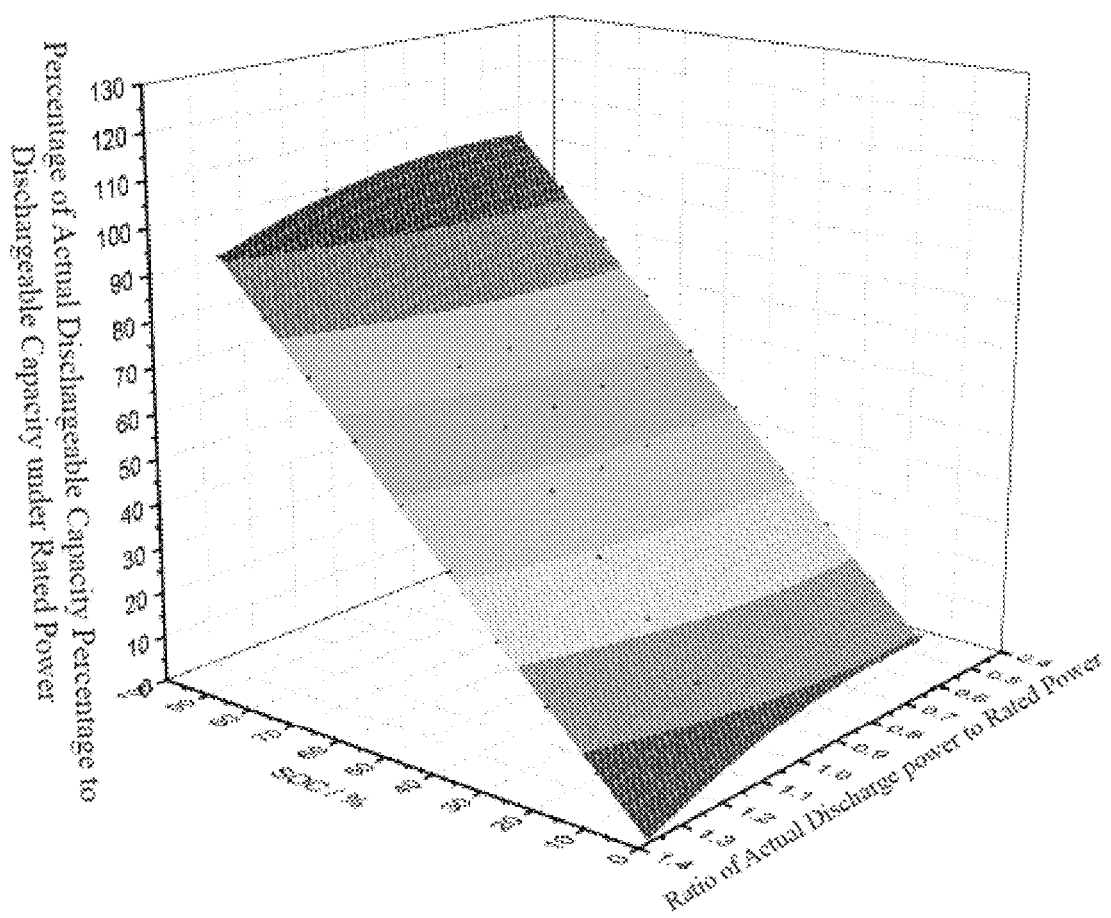
FIG. 9 is a sample graph representing a curved surface showing $R_{(SOC,P)}$ under any SOC within a range of 0% to 100% and discharge power ranging from 0 to $P_r$ according to the fourth embodiment and the fifth embodiment of the present invention.

To be specific, it is possible to draw a graph of $R_{(SOC,P)}$ under any SOC and discharge power using Orgin, Matlab, CurveExpert or other conventional fitting software, wherein SOC is within a range of 0% to 100%, and the discharge power ranges from 0 to Pr. FIG. 9 is a graph of $R_{(SOC,P)}$ for certain set of flow battery system under any SOC within a range of 0% to 100% and discharge power ranging from 0 to Pr. The numerical expression corresponding to the graph in FIG. 9 is $R_{(SOC,P)} = -17.4673 + 1.05696x + 35.13839y - 0.000479652x^2 - 29.95843y^2 + 0.00438xy$, wherein x represents SOC of the flow battery, y represents a ratio of the discharge power to the rated power of the flow battery, and flow batteries of different specifications manufactured by different manufacturers may possibly correspond to curved relation sample graphs of different shapes and expressions, but the obtainment process is the same as the above experimental process.

Figure 10:
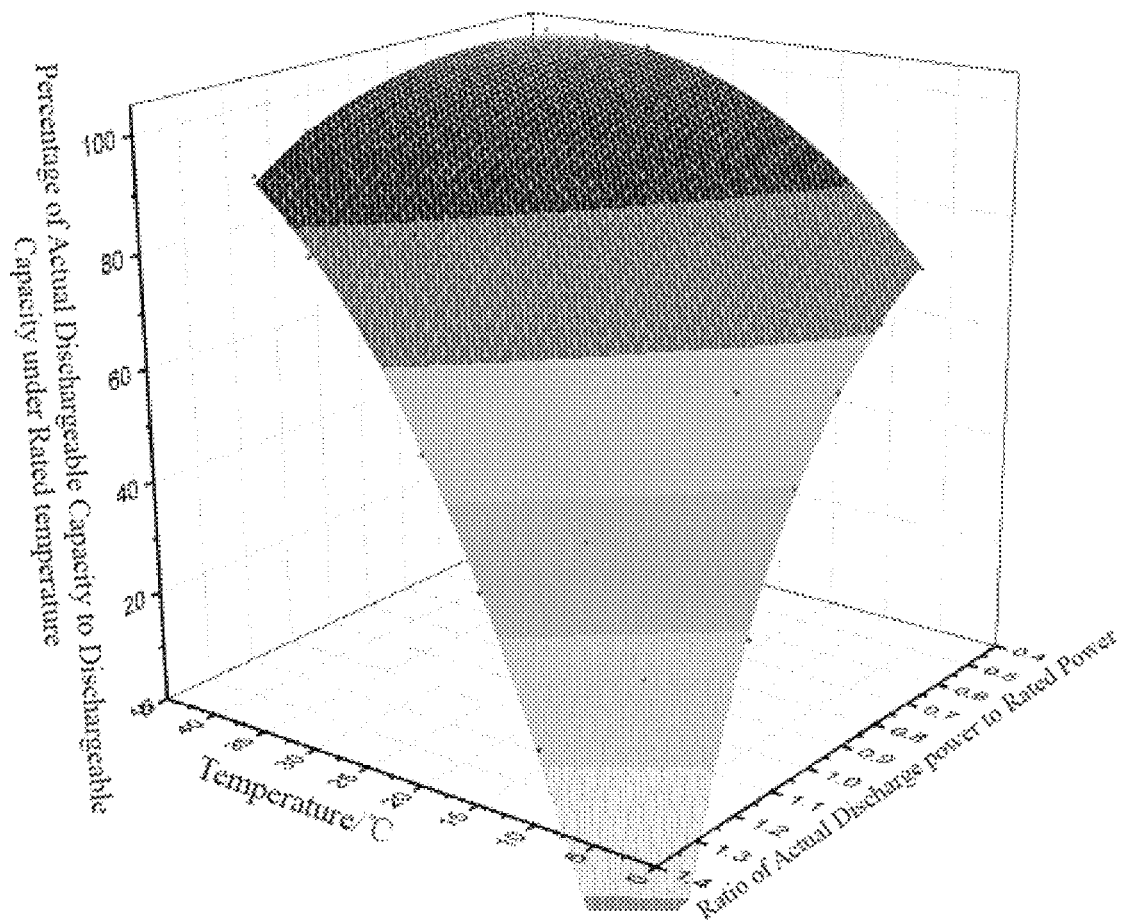
FIG. 10 is a sample graph representing a curved surface showing $R_{(T,P)}$ under any electrolyte temperature within a range of 0° C. to 50° C. and discharge power ranging from 0 to $P_r$ according to the fourth embodiment and the fifth embodiment of the present invention.

According to the fourth embodiment and the fifth embodiment of the present invention, each pre-stored $R_{(T,P)}$ of the actual dischargeable capacity to the rated discharge capacity of the flow battery operating under the conditions of different electrolyte temperatures and different ratios of the discharge power to the rated power is acquired according to the following process: discharging the flow battery at different constant powers under different electrolyte temperatures, wherein different electrolyte temperatures may be in a range of 0° C. to 50° C., the discharging operation of the flow battery can be performed at every certain electrolyte temperature interval (e.g., 2° C.), or can be performed at each electrolyte temperature in the range of 0° C. to 50° C.; further obtaining a plurality of corresponding actual dischargeable capacity values $C_d$ (i.e., the actual capacity $C_d$ discharged by the flow battery under any electrolyte temperature within a range of 0° C. to 50° C. and discharge power ranging from 0 to $P_r$) of the flow battery respectively operating under each electrolyte temperature and under each discharge power by adopting different discharge powers (e.g., $0.1P_r, 0.2P_r \ldots P_r$), wherein $P_r$ is the rated power of the flow battery, and the corresponding different discharge powers $0.1P_r, 0.2P_r \ldots P_r$ correspond to different ratios 0.1, 0.2 . . . 1 of the discharge power to the rated power, i.e., obtaining a corresponding relationship among the actual dischargeable capacity, and the electrolyte temperature and the ratio of the discharge power to the rated power of the flow battery; further obtaining $R_{(T,P)}$ (a ratio of the actual capacity $C_d$ discharged by the flow battery to the rated discharge capacity $C_r$ of the flow battery) under any electrolyte temperature within a range of 0° C. to 50° C. and discharge power ranging from 0 to $P_r$, to be specific, it is possible to draw a curved relation graph of $R_{(T,P)}$ under any electrolyte temperature within a range of 0° C. to 50° C. and discharge power ranging from 0 to $P_r$ using Orgin, Matlab, CurveExpert or other conventional fitting software. FIG. 10 illustrates a graph of $R_{(T,P)}$ for certain set of flow battery system under any electrolyte temperature within a range of 0° C. to 50° C. and discharge power ranging from 0 to $P_r$, wherein the numerical expression of the graph is $R_{(T,P)} = (35355900 - 3260090t - 1041160000y + 997749000y^2 - 13511200ty)/(1 + 6355.3459t - 1351.31452y - 11521500t^2 + 7291280y^2 - 15034.47789ty)$, wherein t represents the electrolyte temperature, y represents a ratio of the discharge power and the rated power of the flow battery, and flow batteries of different specifications manufactured by different manufacturers may possibly correspond to curved relation sample graphs of different shapes and expressions, but the obtainment process is the same as the above experimental process.

Figure 11:
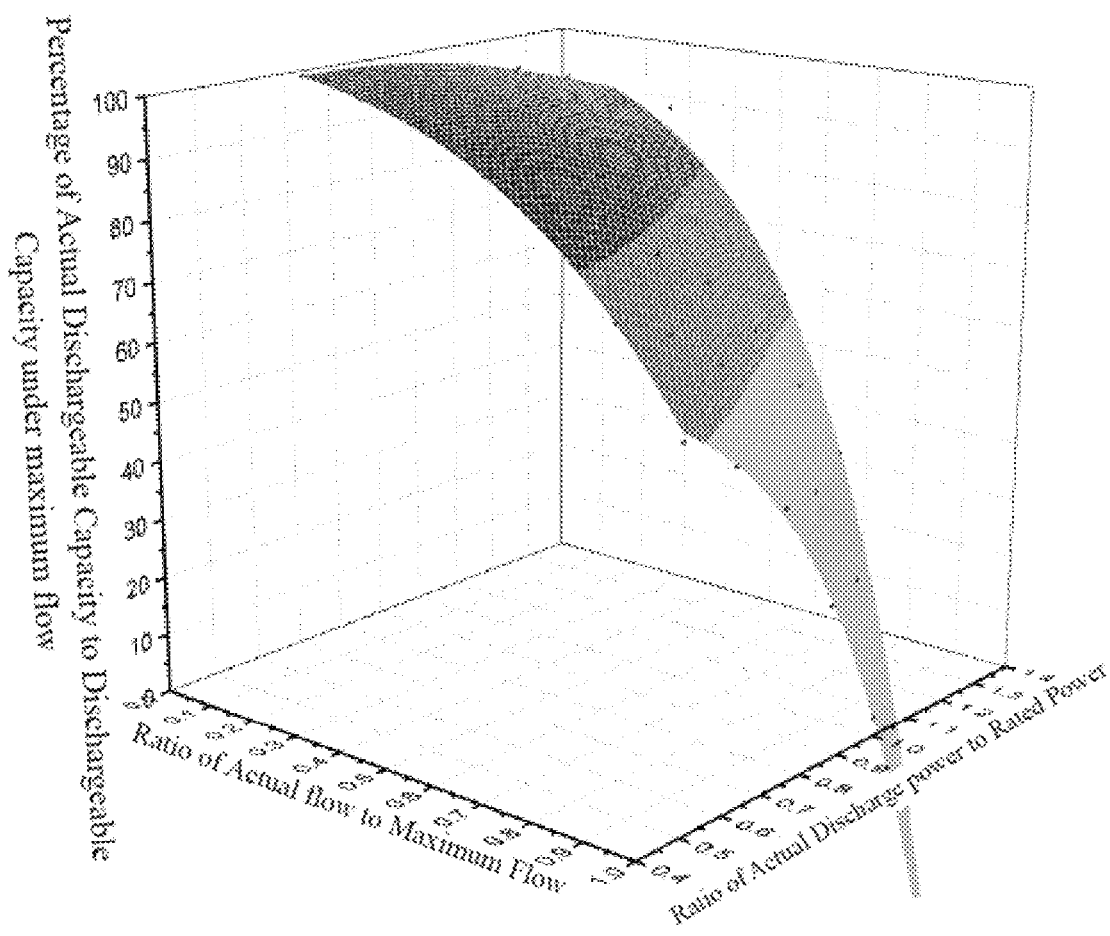
FIG. 11 is a sample graph representing a curved surface showing $R_{(F,P)}$ and under any electrolyte flow within a range of 0% to 100% and discharge power ranging from 0 to $P_r$ according to the fourth embodiment and the fifth embodiment of the present invention.

According to the fourth embodiment and the fifth embodiment of the present invention, each pre-stored $R_{(F,P)}$ of the actual dischargeable capacity to the rated discharge capacity of the flow battery operating under the conditions of different electrolyte flows and different ratios of the discharge power to the rated power is acquired according to the following process: discharging the flow battery at different constant powers under different electrolyte flows, wherein different electrolyte flows may be in a range of 0% to 100% of the maximum electrolyte flow, the discharging operation of the flow battery can be performed at every certain electrolyte flow interval (e.g., 5%), or can be performed under each electrolyte flow in the range of 0% to 100%; further obtaining a corresponding to actual power capacity values $C_d$ (i.e., the actual capacity $C_d$ discharged by the flow battery under any electrolyte temperature within a range of 0% to 100% and discharge power ranging from 0 to $P_r$,) of the flow battery respectively operating under each electrolyte flow and under each discharge power by adopting different discharge powers (e.g., $0.1P_r$, $0.2P_r$ ... $P_r$), wherein $P_r$ is the rated power of the flow battery, and the corresponding different discharge powers $0.1P_r$, $0.2P_r$ ... $P_r$ correspond to different ratios $0.1, 0.2 \ldots 1$ of the discharge power to the rated power, i.e., obtaining a corresponding relationship among the actual dischargeable capacity, and the electrolyte temperature and the ratio of the discharge power to the rated power; further obtaining $R_{(F,P)}$ (a ratio of the actual capacity $C_d$ disclosed by the flow battery to the rated discharge capacity $C_r$ of the flow battery) under any electrolyte temperature within a range of 0% to 100% and discharge power ranging from 0 to $P_r$, to be specific, it is possible to draw a curved relation graph of $R_{(F,P)}$ under any electrolyte temperature within a range of 0° C. to 50° C. and discharge power ranging from 0 to $P_r$ using Orgin, Matlab, CurveExpert or other conventional fitting software. FIG. 11 illustrates a graph of $R_{(F,P)}$ for certain set of flow battery system under any electrolyte temperature within a range of 0% to 100% and discharge power ranging from 0 to $P_r$. The numerical expression of the graph in FIG. 11 is $R_{(F,P)}=(99.81343-57.90947f-34.2676y-17.13953y^2+10.06235y^3)/(1-0.50034f+0.03846f^2+0.0677f^3-0.58371y+0.14669y^2)$, wherein f represents the electrolyte flow, y represents a ratio of the discharge power and the rated power of the flow battery, and flow batteries of different specifications manufactured by different manufacturers may possibly correspond to curved relation sample graphs of different shapes and expressions, but the obtainment process is the same as the above experimental process.

Similarly, with respect to different flow batteries, a curved relation graph of $R'_{(SOC,P)}$ can be acquired under any SOC within a range of 0% to 100% and charge power ranging from 0 to $P_r$ by adopting the above experimental process; a curved relation graph of $R'_{(T,P)}$ is obtained under any the electrolyte temperature within a range of 0° C. to 50° C. and charge power ranging from 0 to $P_r$ by adopting the above experimental process; a curved relation graph of $R'_{(F,P)}$ is obtained under any electrolyte flow within a range of 0% to 100% and charge power ranging from 0 to $P_r$ by adopting the above experimental process.

Figure 12:
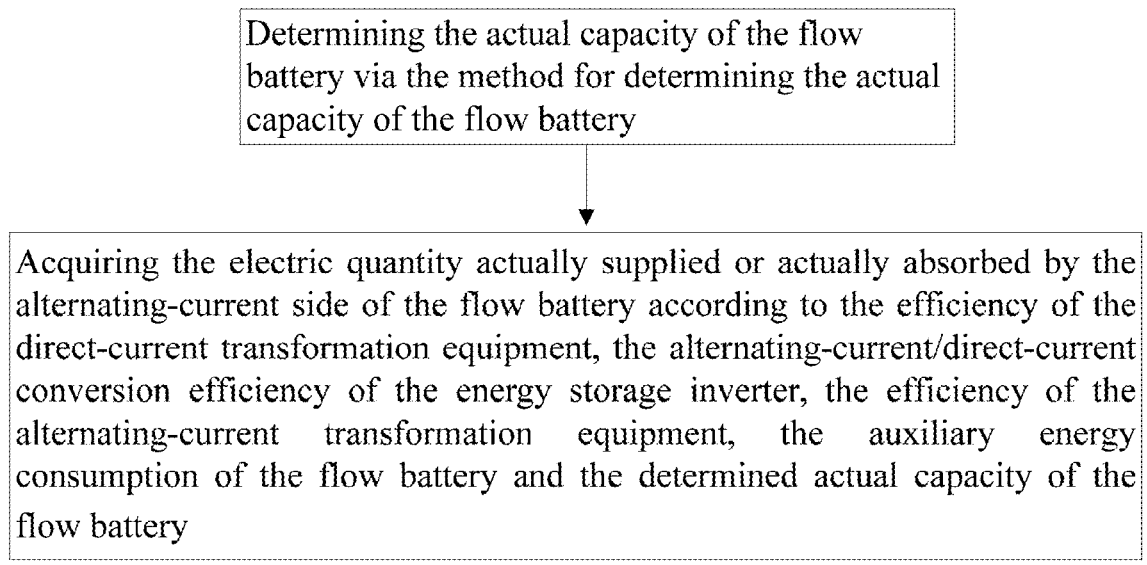
FIG. 12 is a flowchart representing a method for estimating an input-output characteristic of an alternating-current side of a flow battery according to the sixth embodiment of the present invention.
Figure 14:
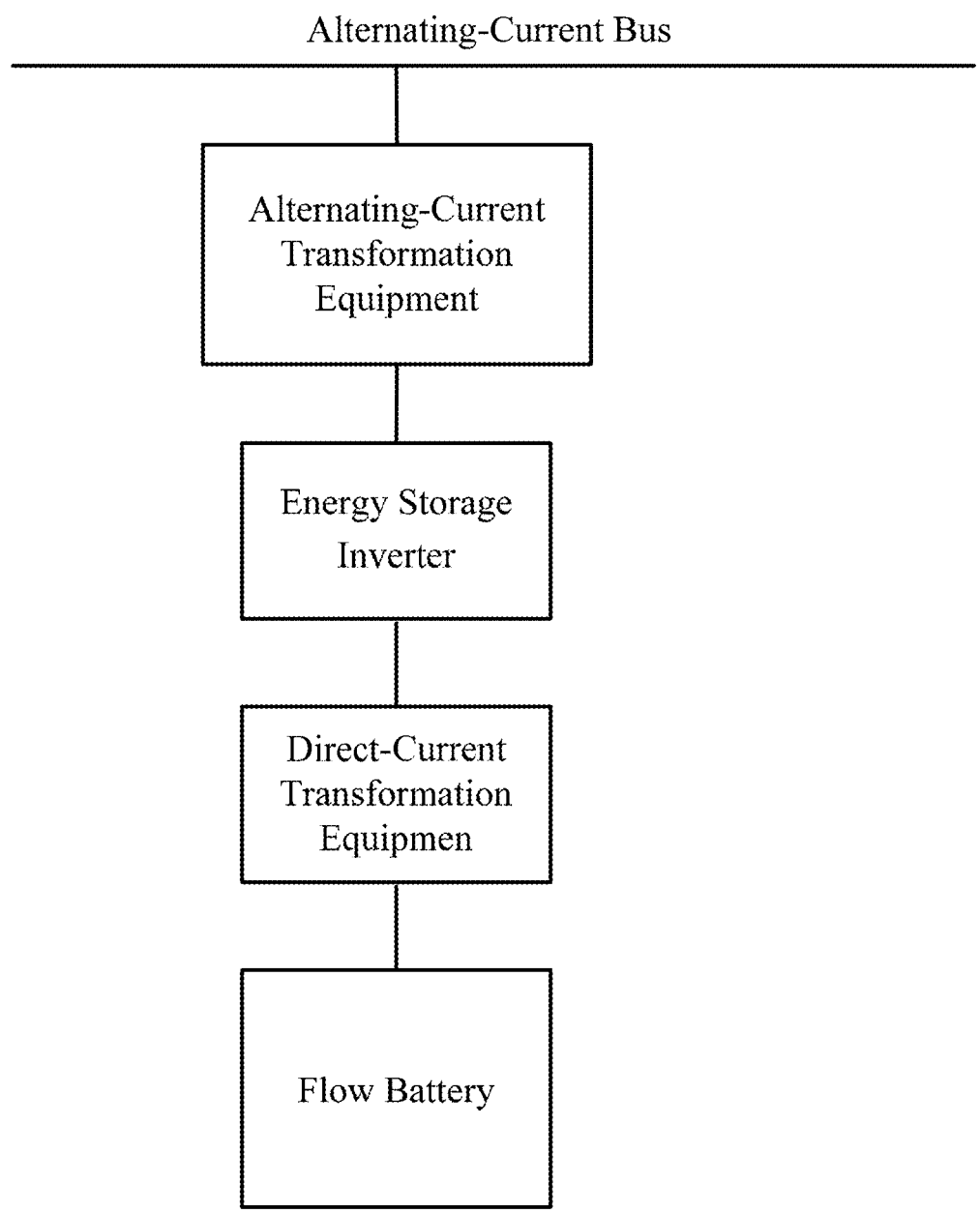
FIG. 14 is a schematic drawing representing a connection between the flow battery and the alternating-current side of the flow battery according to the sixth embodiment and the seventh embodiment of the present invention.

FIG. 12 is a flowchart representing a method for estimating an input-output characteristic of an alternating-current side of a flow battery according to the sixth embodiment of the present invention. FIG. 14 is a schematic drawing representing a connection between the flow battery and the alternating-current side thereof according to the sixth embodiment the present invention. According to the method for establishing the input-output characteristic of the alternating-current side of the flow battery as illustrated in FIG. 12 and FIG. 14, an output end of the flow battery is connected with one end of an energy storage inverter with or without the help of direct-current transformation equipment, the other end of the energy storage inverter is connected with an alternating-current bus with or without the help of alternating-current transformation equipment, and a junction between the energy storage inverter and the alternating-current bus or a junction between the alternating-current transformation equipment and the alternating-current bus is taken as the alternating-current side of the flow battery.

The estimation method includes the following steps:

determining an actual capacity of the flow battery according to the method for determining an actual capacity of a flow battery;

obtaining an electric quantity actually supplied or absorbed by the alternating-current side of the flow battery according to the efficiency of the direct-current transformation equipment, an alternating-current/direct-current conversion efficiency of the energy storage inverter, the efficiency of the alternating-current transformation equipment, auxiliary energy consumptions of the flow battery, and the determined actual capacity of the flow battery;

further, the electric quantity actually absorbed by the alternating-current side of the flow battery is acquired according to $E_{ACI}=C_c/(TE_1 \times TE_2 \times TE_3)+EC_A/TE_3$, and the electric quantity actually supplied by the alternating-current side of the flow battery is acquired according to $E_{ACO}=C_d \times (TE_1 \times TE_2 \times TE_3)-EC_A \times TE_3$, wherein $E_{ACO}$ is the electric quantity actually supplied by the alternating-current side when the flow battery is discharged, $E_{ACI}$ is the electric quantity actually absorbed by the alternating-current side when the flow battery is charged, $C_c$ is the actual chargeable capacity of the flow battery, $C_d$ is the actual dischargeable capacity of the flow battery, $TE_1$ is the efficiency of the direct-current transformation equipment, $TE_2$ is the alternating-current/direct-current conversion efficiency of the energy storage inverter, $TE_3$ is the efficiency of the alternating-current transformation equipment, and $EC_A$ is the auxiliary energy consumption of the flow battery; further the estimation method further comprises the following steps: calculating SOC at the alternating-current side of the flow battery via $100\%-E_{ACI}/E'_R$ when the flow battery is charged; calculating SOC at the alternating-current side of the flow battery via $E_{ACO}/E_R$ when the flow battery is discharged; wherein $E'_R$ is the rated electric quantity absorbed by the alternating-current side of the flow battery, and $E_R$ is rated electric quantity discharged by the alternating-current side of the flow battery; further calculating the power actually supplied by the alternating-current side of the flow battery according t $P_{ACO}=P_{LF} \times (TE_1 \times TE_2 \times TE_3)-EC_A \times TE_3$, and the power actually absorbed by the alternating-current side of the flow battery according to $P_{ACI}=P_{LC}/(TE_1 \times TE_2 \times TE_3)+EC_A/TE_3$, wherein $P_{ACO}$ is the power actually supplied by the alternating-current side of the flow battery, $P_{ACI}$ is the power actually absorbed by the alternating-current side of the flow battery, $P_{LC}$ is the charge power of the flow battery, $TE_1$ is the efficiency of the direct-current transformation equipment, $TE_2$ is the alternating-current/direct-current conversion efficiency of the energy storage inverter, $TE_3$ is the efficiency of the alternating-current transformation equipment, $EC_A$ is the auxiliary energy consumption of the flow battery, and $P_{LF}$ is the discharge power of the flow battery; when the power $P_{ACO}$ actually supplied by the alternating-current side of the flow battery or the power $P_{ACI}$ actually absorbed by the alternating-current side of the flow battery is a known quantity predetermined according to user's requirements, the corresponding charge power $P_{LC}$ of the flow battery or the discharge power $P_{LF}$ of the flow battery can be further acquired; further determining whether the power at the alternating-current side of the flow battery changes frequently, and when the power at the alternating-current side of the flow battery changes frequently, if SOC of the flow battery is larger than or equal to a SOC threshold, calculating the electric quantity actually absorbed by the alternating-current side according to $E_{ACI}=C_c/(TE_1 \times TE_2 \times TE_3)+EC_A/TE_3$ when the flow battery is charged, and then calculating SOC at the alternating-current side of the flow battery via $100\%-E_{ACI}/E'_R$ when the flow battery is charged; if the SOC of the flow battery is smaller than the SOC threshold, calculating the electric quantity actually supplied by the alternating-current side according to $E_{ACO}=C_d \times (TE_1 \times TE_2 \times TE_3)-EC_A \times TE_3$ first when the flow battery is discharged, and then calculating SOC at the alternating-current side of the flow battery via $E_{ACO}/E_R$ when the flow battery is discharged; further, determining whether the power at the alternating-current side of the flow battery changes frequently by determining whether a time interval between the changed powers at the alternating-current side of the flow battery is lower than a preset time interval.

Figure 13:
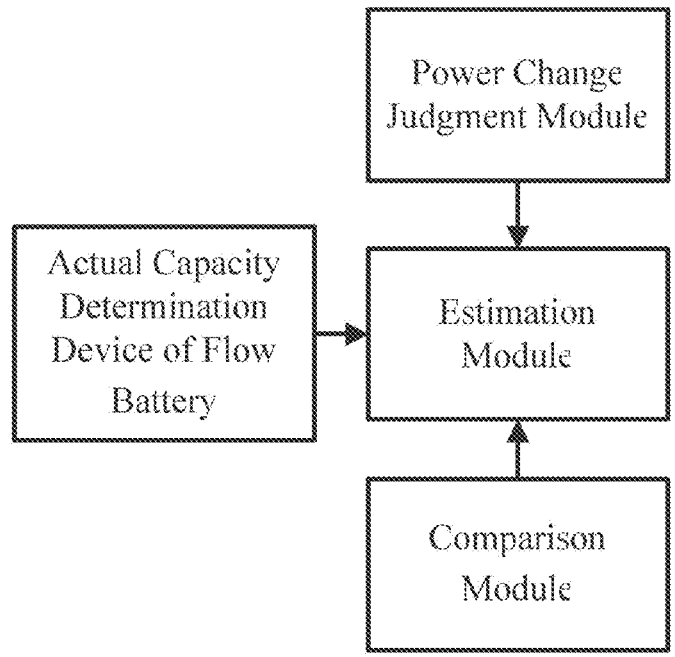
FIG. 13 is a structure block diagram representing a system for estimating an input-output characteristic of an alternating-current side of a flow battery according to the seventh embodiment of the present invention.

FIG. 13 is a structure block diagram representing a system for estimating an input-output characteristic of an alternating-current side of a flow battery according to the seventh embodiment of the present invention. FIG. 14 is a schematic drawing representing a connection between the flow battery and the alternating-current side thereof according to the sixth embodiment and the seventh embodiment of the present invention. According to the method for establishing the input-output characteristic of the alternating-current side of the flow battery as illustrated in FIG. 13 and FIG. 14, an output end of the flow battery is connected with one end of an energy storage inverter with or without the help of direct-current transformation equipment, the other end of the energy storage inverter is connected with an alternating-current bus with or without the help of alternating-current transformation equipment, and a junction between the energy storage inverter and the alternating-current bus or a junction between the alternating-current transformation equipment and the alternating-current bus is taken as the alternating-current side of the flow battery.

The estimation system includes an estimation module connected with the device for determining the actual capacity of the flow battery and configured to determine an electric quantity actually supplied or absorbed by the alternating-current side of the flow battery according to the efficiency of the direct-current transformation equipment, an alternating-current/direct-current conversion efficiency of the energy storage inverter, the efficiency of the alternating-current transformation equipment, auxiliary energy consumption of the flow battery, and the determined actual capacity of the flow battery.

Further, the estimation module is configured to acquire the electric quantity actually absorbed by the alternating-current side of the flow battery according to $E_{ACO}=C_d \times (TE_1 \times TE_2 \times TE_3)-EC_A \times TE_3$ and the electric quantity actually supplied by the alternating-current side of the flow battery according to $E_{ACI}=C_c/(TE_1 \times TE_2 \times TE_3)+EC_A/TE_3$, wherein $E_{ACO}$ is the electric quantity actually supplied by the alternating-current side when the flow battery is discharged, $E_{ACI}$ is the electric quantity actually absorbed by the alternating-current side when the flow battery is charged, $C_c$ is the actual chargeable capacity of the flow battery, $C_d$ is the actual dischargeable capacity of the flow battery, $TE_1$ is the efficiency of the direct-current transformation equipment, $TE_2$ is the alternating-current/direct-current conversion efficiency of the energy storage inverter, $TE_3$ is the efficiency of the alternating-current transformation equipment, and $EC_A$ is auxiliary energy consumption of the flow battery; further, the estimation module is configured to acquire SOC at the alternating-current side of the flow battery via $100\%-E_{ACI}/E'_R$ when the flow battery is charged, and acquire SOC at the alternating-current side of the flow battery via $E_{ACO}/E_R$ when the flow battery is discharged, wherein $E'_R$ is the rated electric quantity absorbed by the alternating-current side of the flow battery, and $E_R$ is the rated electric quantity discharged by the alternating-current side of the flow battery; further, the power actually supplied by the alternating-current side of the flow battery is acquired according to $P_{ACO}=P_{LF} \times (TE_1 \times TE_2 \times TE_3)-EC_A \times TE_3$, and the power actually absorbed by the alternating-current side of the flow battery is acquired according to $P_{ACI}=P_{LC}/(TE_1 \times TE_2 \times TE_3)+EC_A/TE_3$, wherein $P_{ACO}$ is the power actually supplied by the alternating-current side of the flow battery, $P_{ACI}$ is the power actually absorbed by the alternating-current side of the flow battery, $P_{LC}$ is the charge power of the flow battery, $TE_1$ is the efficiency of the direct-current transformation equipment, $TE_2$ is the alternating-current/direct-current conversion efficiency of the energy storage inverter, $TE_3$ is the efficiency of the alternating-current transformation equipment, $EC_A$ is the auxiliary energy consumption of the flow battery, and $P_{LF}$ is the discharge power of the flow battery; when the power $P_{ACO}$ actually supplied by the alternating-current side of the flow battery or the power $P_{ACI}$ actually absorbed by the alternating-current side of the flow battery is a known quantity predetermined according to user's requirements, the corresponding charge power $P_{LC}$ of the flow battery or the discharge power $P_{LF}$ of the flow battery can be further acquired; the estimation system further comprises a power change judgment module configured to judge whether the power at the alternating-current side changes frequently and a comparison module configured to compare SOC of the flow battery with a SOC threshold; when the power at the alternating-current side of the flow battery changes frequently, if SOC of the flow battery is larger than or equal to the SOC threshold, the electric quantity actually absorbed by the alternating-current side is acquired according to $E_{ACI}=C_c/(TE_1 \times TE_2 \times TE_3)+EC_A/TE_3$ when the flow battery is charged, then and SOC at the alternating-current side of the flow battery is acquired via $100\%-E_{ACI}/E'_R$ when the flow battery is charged; if the SOC of the flow battery is smaller than the SOC threshold, the electric quantity actually supplied by the alternating-current side is acquired according to $E_{ACO}=C_d \times (TE_1 \times TE_2 \times TE_3)-EC_A \times TE_3$ first when the flow battery is discharged, and then the SOC at the alternating-current side of the flow battery is acquired via $E_{ACO}/E_R$ when the flow battery is discharged; further, the power change judgment module is configured to determine whether the power at the alternating-current side of the flow battery changes frequently by determining whether a time interval between the changed powers at the alternating-current side of the flow battery is lower than a preset time interval; the SOC threshold can be taken as 50%, and the preset time interval can be taken as a second level and below.

FIG. 14 is a schematic drawing illustrating a connection between the flow battery and the alternating-current side thereof. As illustrated in FIG. 14, an output end of the flow battery is connected with one end of an energy storage inverter with or without the help of direct-current transformation equipment, the other end of the energy storage inverter is connected with an alternating-current bus with or without the help of alternating-current transformation equipment, and in FIG. 14, a junction between the alternating-current transformation equipment and the alternating-current bus is taken as the alternating-current side of the flow battery. In actual application, the output end of the flow battery may also be directly connected with one end of the energy storage inverter, i.e., without the help the direct-current transformation equipment, then the estimation module at this moment acquires an electric quantity actually supplied or absorbed by the alternating-current side of the flow battery according to the alternating-current/direct-current conversion efficiency of the energy storage inverter, the efficiency of the alternating-current transformation equipment, auxiliary energy consumption of the flow battery, and the acquired capacity information of the flow battery. To be specific, calculating the electric quantity actually supplied by the alternating-current side of the flow battery according to the formula $E_{ACO}=C_d \times (TE_1 \times TE_2 \times TE_3) - EC_A \times TE_3$ and calculating the electric quantity actually absorbed by the alternating-current side of the flow battery according to $E_{ACI}=C_c/(TE_1 \times TE_2 \times TE_3) + EC_A/TE_3$; correspondingly when the charge power of the flow battery or the discharge power of the flow battery is estimated, the formulas adopted are also changed to $P_{ACO}=P_{LF} \times (TE_2 \times TE_3) - EC_A \times TE_3$ according to which the power actually absorbed by the alternating-current side of the flow battery is acquired, and $P_{ACI}=P_{LC}/(TE_1 \times TE_2 \times TE_3) + EC_A/TE_3$ according to which the power actually absorbed by the alternating-current side of the flow battery is acquired. In actual application, the other end of the energy storage inverter may also be directly connected with the alternating-current bus, i.e., without the help of the alternating-current transformation equipment, that is, the junction between the energy storage inverter and the alternating-current bus is taken as the alternating-current side of the flow battery; then if the output end of the flow battery at this moment is connected with one end of the energy storage inverter with the help of the direct-current transformation equipment, the estimation module acquires an electric quantity actually supplied or absorbed by the alternating-current side of the flow battery according to the efficiency of the direct-current transformation equipment, the alternating-current/direct-current conversion efficiency of the energy storage inverter, auxiliary energy consumption of the flow battery, and the acquired capacity information of the flow battery. To be specific, calculating the electric quantity actually supplied by the alternating-current side of the flow battery according to the formula $E_{ACO}=C_d \times (TE_1 \times TE_2 \times TE_3) - EC_A \times TE_3$ and calculating the electric quantity actually absorbed by the alternating-current side of the flow battery according to $E_{ACI}=C_c/(TE_1 \times TE_2 \times TE_3) + EC_A/TE_3$; correspondingly when the charge power of the flow battery or the discharge power of the flow battery is estimated, the formulas adopted are also changed to $P_{ACO}=P_{LF} \times (TE_2 \times TE_3) - EC_A \times TE_3$ according to which the power actually supplied by the alternating-current side of the flow battery is acquired, and $E_{ACI}=C_c/(TE_1 \times TE_2 \times TE_3) + EC_A/TE_3$ according to which the power actually absorbed by the alternating-current side of the flow battery is acquired. In actual application, the output end of the flow battery may also be directly connected with one end of the energy storage inverter, and the other end of the energy storage inverter is directly connected with the alternating-current bus, i.e., neither the direct-current transformation equipment, or the alternating-current transformation equipment is provided between the flow battery and the alternating-current side thereof, and then the estimation module at this moment acquires an electric quantity actually supplied or absorbed by the alternating-current side of the flow battery according to the alternating-current/direct-current conversion efficiency of the energy storage inverter, auxiliary energy consumption of the flow battery, and the acquired capacity information of the flow battery, to be specific, calculating the electric quantity actually supplied by the alternating-current side of the flow battery according to the formula $E_{ACO}=C_d \times (TE_1 \times TE_2 \times TE_3) - EC_A \times TE_3$ and calculating the electric quantity actually absorbed by the alternating-current side of the flow battery according to $E_{ACI}=C_c/(TE_1 \times TE_2 \times TE_3) + EC_A/TE_3$; correspondingly when the charge power of the flow battery or the discharge power of the flow battery is estimated, the formulas adopted are also changed to $P_{ACO}=P_{LF} \times (TE_2 \times TE_3) - EC_A \times TE_3$ according to which the power actually absorbed by the alternating-current side of the flow battery is acquired, and $E_{ACI}=C_c/(TE_1 \times TE_2 \times TE_3) + EC_A/TE_3$ according to which the power actually absorbed by the alternating-current side of the flow battery is acquired; in addition, when performing electric quantity calculation processing at the alternating-current side of the flow battery, the estimation module acquires the corresponding efficiency of the direct-current transformation equipment, alternating-current/direct-current conversion efficiency of the energy storage inverter and efficiency of the alternating-current transformation equipment respectively first according to the input voltage/output voltage condition of the direct-current transformation equipment, alternating-current to direct-current/direct-current to alternating-current conversion of the energy storage inverter and the input voltage/output voltage of the alternating-current transformation equipment; with respect to certain specific flow battery as well as the structure configuration and connection between the known flow battery and the alternating-current side thereof, the rated electric quantity $E'_R$ absorbed by the alternating-current side of the flow battery and the rated electric quantity $E_R$ discharged by the alternating-current side of the flow battery are known quantities, where $E_R=C_r \times (TE_1 \times TE_2 \times TE_3) - EC_A \times TE_3$, and $E'_R=C'_r/(TE_1 \times TE_2 \times TE_3) + EC_A/TE_3$, wherein $C_r$ is a rated discharge capacity of the flow battery, is generally entitled by a manufacturer and is specifically the capacity at least dischargeable by the flow battery under standard conditions: e.g., SOC is 100%, the electrolyte temperature is 40° C., and the electrolyte flow is the capacity obtained by discharging the flow battery at a rated power under the condition of maximum flow; $C'_r$ is a rated charge capacity of the flow battery, is generally entitled by a manufacturer and is specifically the capacity chargeable by the flow battery under standard conditions: e.g., SOC is 100%, the electrolyte temperature is 40° C., and the electrolyte flow is the capacity obtained by charging the flow battery at a rated power under the condition of the maximum flow.

Figure 15:
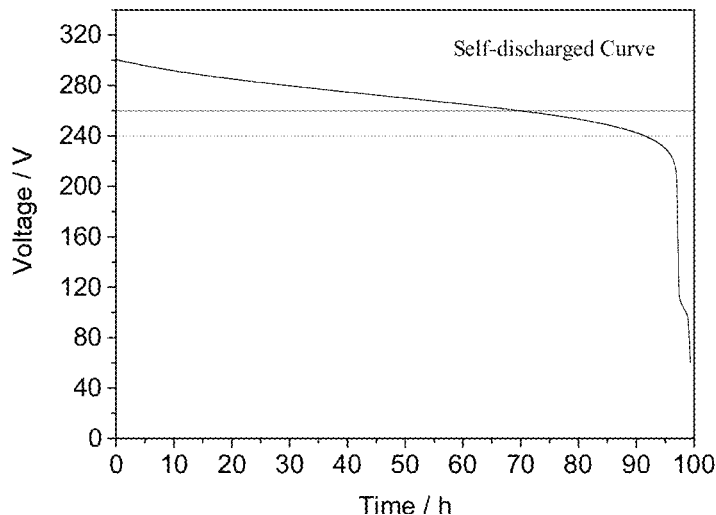
FIG. 15 shows a relation between power and capacity characteristics when the flow battery runs in a non-load state according to the sixth embodiment and the seventh embodiment of the present invention.
Figure 16:
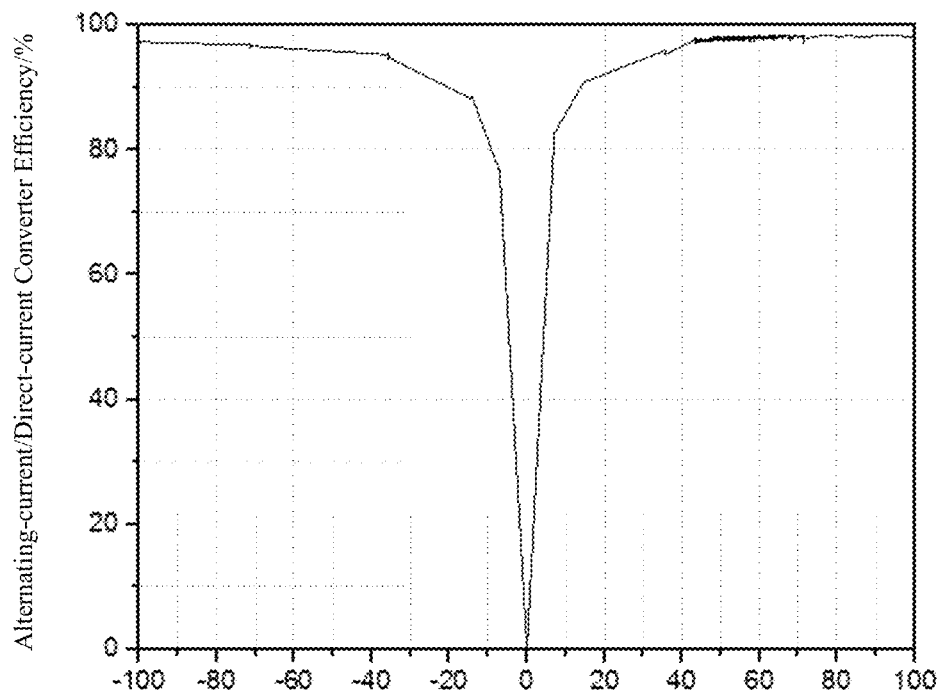
FIG. 16 is a curved sample graph representing a relationship between the alternating-current/direct-current conversion efficiency of an energy storage inverter and the output/input power ratio of the energy storage inverter according to the sixth embodiment and the seventh embodiment of the present invention.

In the sixth embodiment and the seventh embodiment of the present invention, the auxiliary energy consumptions of the flow battery refer to power consumptions of auxiliary equipment, such as a magnetic drive pump, a heat exchange system, a ventilation system, a battery management system and a sensor. The corresponding auxiliary power consumptions can be acquired by additionally arranging gauges having electric energy and power metering functions on the alternating-current bus of the auxiliary equipment and counting metered electric energy consumptions, and may also be acquired according to a specific time work plan for the auxiliary equipment, for example, the time work plan of the ventilation system is enabled at PM2: 00 to PM3: 00, and then the auxiliary energy consumption within this period can be counted accordingly; the auxiliary power consumption can also be pre-estimated according to a state of the direct-current side of the flow battery, e.g., discharging at an alternating-current power of 30%; because the power at the direct-current side will be larger than that in the alternating-current side in a discharging process, it is assumed that the corresponding power at the direct-current side is approximately 40%, the current direct-current SOC of the flow battery is about 50%, according to the direct-current characteristic, SOC at the direct-current side can be reduced to 30% from 50% by means of discharging at direct-current power of 40%, and in this process, the consumption of the magnetic drive pump is 10 kWh generally, the power of the magnetic drive pump is 2 kW within a direct-current SOC interval being 50% to 40%, and the power of the magnetic drive pump is 5 kW within a SOC interval being 40% to 30%. In the presence of the above parameters, cycle iteration is performed till data approaches to real values. When the flow battery operates in a non-load (self-discharged) state, the power and the capacity will not be reflected on an alternating-current main outlet (i.e., the alternating-current side of the flow battery), and therefore it is just to pay attention to SOC at the direct-current side merely at this moment. FIG. 15 illustrates a power and capacity characteristic curve (self-discharged curve) when the flow battery operates in a non-load state. FIG. 16 is a curved sample graph representing the relationship between the alternating-current/direct-current conversion efficiency of the energy storage inverter and an output/input power ratio of the energy storage inverter, wherein when the energy storage inverter is charged, the output/input power ratio specifically refers to a ratio of the power at the direct-current side of the energy storage inverter to the power of the alternating-current side of the energy storage inverter, and when the energy storage inverter is discharged, the output/input power ratio specifically refers to a ratio of the power at the alternating-current side of the energy storage inverter and the power at the direct-current side of the inverter.

The contents described above are preferred specific embodiments of the present invention, but the protection scope of the present invention is not limited to this, and equivalent replacements or alternations made by any person skilled in the art within the technical scope disclosed in the present invention and according to the technical solution and inventive concept of the present invention should be all covered by the protection scope of the present invention.

The invention claimed is:

1. A device for determining an actual capacity of a flow battery, wherein the flow battery system comprises a stack, an anode electrolyte storage tank, a cathode electrolyte storage tank, and an electrolyte circulating pipeline, wherein the determination device comprises:
   a state of charge (SOC) monitoring system comprising:
      a plurality of SOC detection devices configured to determine SOCs of at least two pairs of different monitoring positions, wherein each pair of monitoring positions are disposed on an inside of the anode electrolyte storage tank and an inside of the cathode electrolyte storage tank, on an anode electrolyte outlet pipeline of the stack and on a cathode electrolyte outlet pipeline of the stack, or on an anode electrolyte inlet pipeline of the stack and on a cathode electrolyte inlet pipeline of the stack; and
      a connection monitoring device, and a SOC acquisition module configured to acquire a state of charge $SOC_{sum}$ of the flow battery system according to SOCs respectively corresponding to each pair of the monitoring positions,
   a parameter learning module configured to learn a current operating state parameter of the flow battery; and
   an actual capacity determination module connected with the state of charge (SOC) monitoring system and the parameter learning module of the flow battery system,
   wherein $SOC_{sum}$ is the SOC of the flow battery and the actual capacity determination module is configured to determine the actual capacity of the flow battery according to the acquired SOC of the flow battery and the learnt current operating state parameters of the flow battery and in combination with the corresponding relationship among the actual capacity of the flow battery, and SOC of the flow battery and the operating state parameters of the flow battery.

2. The device for determining an actual capacity of a flow battery according to claim 1, wherein the determination device further comprises a storage module connected with the actual capacity determination module; the storage module is configured to pre-store ratios of the actual dischargeable capacity to the rated discharge capacity of the flow battery operating under the conditions of different SOCs and different ratios of the discharge power to the rated power in advance; pre-store ratios of the actual dischargeable capacity to the rated discharge capacity of the flow battery operating under the conditions of different electrolyte temperatures and different ratios of the discharge power to the rated power in advance; pre-store ratios of the actual dischargeable capacity to the rated discharge capacity of the flow battery operating under the conditions of different electrolyte flows and different ratios of the discharge power to the rated power in advance; pre-store ratios of the actual chargeable capacity to the rated charge capacity of the flow battery operating under the conditions of different SOCs and different ratios of the charge power to the rated power in advance; pre-store ratios of the actual chargeable capacity to the rated charge capacity of the flow battery operating under the conditions of different electrolyte temperatures and different ratios of the charge power to the rated power in advance; and pre-store ratios of the actual chargeable capacity to the rated charge capacity of the flow battery operating under the conditions of different electrolyte flows and different ratios of the charge power to the rated power in advance.

3. A method for determining an actual capacity of a flow battery using the device of claim 1, comprising the following steps:
   Step 1: acquiring state of charge $SOC_{sum}$ of the flow battery system by the SOC state monitoring system and taking $SOC_{sum}$ as SOC of the flow battery;
   Step 2: learning current operating state parameters of the flow battery by the parameter learning module;
   Step 3: determining the actual capacity of the flow battery according to the acquired SOC of the flow battery and the learnt current operating state parameters of the flow battery and in combination with the corresponding relationship among the actual capacity of the flow capacity, and SOC of the flow battery and the operating state parameters of the flow battery by the actual capacity determination module,
   wherein Step 1 further comprises:
   determining SOCs of at least two sets of monitoring positions;

configuring coefficients according to a ratio of a power to a capacity of the flow battery system; according to the SOCs respectively corresponding to each pair of monitoring positions, acquiring a $SOC_{sum}$ of a flow battery system;

calculating the $SOC_{sum}$ of the flow battery system according to a formula $$SOC_{sum} = \sum N \times SOC_n,$$

wherein N is coefficients, N is the sum of n coefficients and equal to 1, n is pairs of monitoring positions, n is equal to 2 or 3.

4. The method according to claim 3, wherein the actual capacity of the flow battery specifically includes an actual dischargeable capacity of the flow battery; the operating state parameters of the flow battery at least include: a ratio of a discharge power to a rated power, electrolyte temperature and electrolyte flow; the corresponding relationship among the actual dischargeable capacity of the flow battery, and SOC of the flow battery and the operating state parameters of the flow battery is $$C_d = C_r \times R_{(SOC,P)} \times R_{(T,P)} \times R_{(F,P)},$$

wherein $C_d$ is the actual dischargeable capacity of the flow battery; $C_r$ the rated discharge capacity of the flow battery; $R_{(SOC,P)}$ is a ratio of the actual dischargeable capacity of the flow battery to the rated discharge capacity of the flow battery under the conditions of different SOCs of the flow battery and different ratios of the discharge power of the flow battery to the rated power of the flow battery; $R_{(T,P)}$ is a ratio of the actual dischargeable capacity of the flow battery to the rated discharge capacity of the flow battery under the conditions of different electrolyte temperatures and different ratios of the discharge power of the flow battery and the rated power of the flow battery; $R_{(F,P)}$ is a ratio of the actual dischargeable capacity of the flow battery to the rated discharge capacity of the flow battery under the conditions of different electrolyte flows and different ratios of the discharge power of the flow battery to the rated power of the flow battery.

5. The method according to claim 4, wherein the actual capacity of the flow battery further includes an actual chargeable capacity of the flow battery; the operating state parameters of the flow battery further include: a ratio of a charge power to a rated power; the corresponding relationship among the actual chargeable capacity of the flow battery, and SOC of the flow battery and the operating state parameters of the flow battery is $$C_c = C'_r \times R'_{(SOC,P)} \times R'_{(T,P)} \times R'_{(F,P)},$$

wherein $C_c$ is the actual chargeable capacity of the flow battery; $C'_r$ is the rated charge capacity of the flow battery; $R_{(SOC,P)}'$ is a ratio of the actual chargeable capacity of the flow battery to the rated charge capacity of the flow battery under the conditions of different SOCs of the flow battery and different ratios of the charge power of the flow battery to the rated power of the flow battery; $R_{(T,P)}'$ is a ratio of the actual chargeable capacity of the flow battery to the rated charge capacity of the flow battery under the conditions of different electrolyte temperatures and different ratios of the charge power of the flow battery to the rated power of the flow battery; $R_{(F,P)}'$ is a ratio of the actual chargeable capacity of the flow battery to the rated charge capacity of the flow battery under the conditions of different electrolyte flows and different ratios of the charge power of the flow battery to the rated power of the flow battery.

6. The method according to claim 5, wherein the method comprises: pre-storing ratios of the actual dischargeable capacity to the rated discharge capacity of the flow battery operating under the conditions of different SOCs and different ratios of the discharge power to the rated power in advance; pre-storing ratios of the actual dischargeable capacity to the rated discharge capacity of the flow battery operating under the conditions of different electrolyte temperatures and different ratios of the discharge power and the rated power in advance; pre-storing ratios of the actual dischargeable capacity to the rated discharge capacity of the flow battery operating under the conditions of different electrolyte flows and different ratios of the discharge power to the rated power in advance; pre-storing ratios of the actual chargeable capacity to the rated charge capacity of the flow battery operating under the conditions of different SOCs and different ratios of the charge power to the rated power in advance; pre-storing ratios of the actual chargeable capacity to the rated charge capacity of the flow battery operating under the conditions of different electrolyte temperatures and different ratios of the charge power to the rated power in advance; pre-storing ratios of the actual chargeable capacity to the rated charge capacity of the flow battery operating under the conditions of different electrolyte flows and different ratios of the charge power to the rated power in advance.

7. The method for determining an actual capacity of a flow battery according to claim 5, wherein the Step 3 is specifically as follows: determining corresponding parameters $R_{(SOC,P)}$, $R_{(T,P)}$ and $R_{(F,P)}$ according to the acquired SOC of the flow battery, the ratio of the current discharge power to the rated power of the flow battery, the electrolyte temperature and the electrolyte flow, and further obtaining the actual dischargeable capacity $C_d$ of the flow battery in combination with $$C_d = C_r \times R_{(SOC,P)} \times R_{(T,P)} \times R_{(F,P)};$$

determining corresponding parameters $R_{(SOC,P)}'$, $R_{(T,P)}'$ and $R_{(F,P)}'$ according to the acquired SOC of the flow battery, and the ratio of the current charge power to the rated power of the flow battery, the electrolyte temperature and the electrolyte flow, and further obtaining the actual chargeable capacity $C_c$ of the flow battery in combination with $$C_c = C'_r \times R'_{(SOC,P)} \times R'_{(T,P)} \times R'_{(F,P)}.$$

8. A flow battery comprising a stack, an anode electrolyte storage tank, a cathode electrolyte storage tank, an electrolyte circulating pipeline, and a device for determining an actual capacity of the flow battery of claim 1 that comprises at least two pairs of SOC detection devices installed at a pair of monitoring positions, and a battery management system that comprises:
- a SOC calculation module configured to obtain a SOC value corresponding to each SOC detection device according to a signal detected by the SOC detection device that is in an operating state;
- a SOC fault judgment module configured to compare the calculated SOC values, and determine the SOC detection device that is in a faulty state; and
- a SOC fault elimination module configured to execute a closing operation of valves at two ends of the SOC detection device that is in a faulty state.

9. The flow battery according to claim 8, wherein the SOC fault judgment module is configured to determine whether the SOC detection device is in a faulty state according to a preset fault judgment program, the preset fault judgment program including:
   when more than two pairs of SOC detection devices are in an operating state, a working mode of the SOC fault judgment module is as follows:
   performing difference-making comparison on each SOC value obtained by calculation and other SOC value, if a difference between the current SOC value and other SOC value is larger than a set fault threshold $Y^1$, then determining that the SOC detection device corresponding to the current SOC value has a fault, and starting the SOC fault elimination module;
   when two pairs of SOC detection devices are in an operating state, a working mode of the SOC fault judgment module comprising:
   determining whether an open-circuit voltage of the two pairs of SOC detection devices is within a set fault threshold $Y^2$, when the voltage of the current SOC detection devices is not within the fault threshold $Y^2$, then determining that the current SOC detection device is in a faulty state, and starting the SOC fault elimination module.

10. The flow battery according to claim 9, wherein, after the SOC fault elimination module is started, the SOC calculation module recalculates SOCs, and the SOC fault judgment module continues to compare the calculated SOC values and determine whether the SOC detection device is in a faulty state.

11. The flow battery according to claim 9, wherein the flow battery comprises at least N pairs of mutually redundant SOC detection devices at the same monitoring position, wherein N−M pairs of SOC detection devices are in an operating state, and M pairs of SOC detection devices are in a standby state, wherein 2≤N−M<N, and N≥3.

12. The flow battery according to claim 9, wherein the battery management system further comprises a state switching module that controls standby SOC detection devices to realize switching between a standby state and an operating state and
   wherein, after the SOC fault elimination module eliminates a closing operation of two valves at two ends of the faulty SOC detection device, the state switching module of the battery management system automatically controls valves at two ends of the standby detection device to be opened and switches the standby SOC detection device from a standby state to an operating state.

* * * * *